(12) United States Patent
Katoh et al.

(10) Patent No.: US 9,583,510 B2
(45) Date of Patent: Feb. 28, 2017

(54) SEMICONDUCTOR DEVICE, DISPLAY DEVICE, AND METHOD FOR MANUFACTURING SEMICONDUCTOR DEVICE

(71) Applicant: Sharp Kabushiki Kaisha, Osaka-shi, Osaka (JP)

(72) Inventors: Sumio Katoh, Osaka (JP); Naoki Ueda, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/910,454

(22) PCT Filed: Jul. 24, 2014

(86) PCT No.: PCT/JP2014/069528
§ 371 (c)(1),
(2) Date: Feb. 5, 2016

(87) PCT Pub. No.: WO2015/019857
PCT Pub. Date: Feb. 12, 2015

(65) Prior Publication Data
US 2016/0181291 A1 Jun. 23, 2016

(30) Foreign Application Priority Data

Aug. 7, 2013 (JP) .................................. 2013-164411

(51) Int. Cl.
*H01L 27/12* (2006.01)
*H01L 27/32* (2006.01)
(Continued)

(52) U.S. Cl.
CPC .... *H01L 27/1225* (2013.01); *G02F 1/136227* (2013.01); *H01L 27/124* (2013.01);
(Continued)

(58) Field of Classification Search
None
See application file for complete search history.

(56) References Cited

U.S. PATENT DOCUMENTS 7,205,571 B2 * 4/2007 Ahn ................... G02F 1/136213
257/59
2006/0145161 A1 * 7/2006 Lee ..................... G02F 1/13458
257/72

(Continued)

FOREIGN PATENT DOCUMENTS

JP 2006-245031 A 9/2006
JP 2012-134475 A 7/2012
(Continued)

OTHER PUBLICATIONS

Official Communication issued in International Patent Application No. PCT/JP2014/069528, mailed on Oct. 7, 2014.

*Primary Examiner* — Benjamin Sandvik
(74) *Attorney, Agent, or Firm* — Keating & Bennett, LLP

(57) ABSTRACT

A semiconductor device (100A) includes a first metal layer (12) including a gate electrode (12g); a gate insulating layer (14) formed on the first metal layer; an oxide semiconductor layer (16) formed on the gate insulating layer; a second metal layer (18) formed on the oxide semiconductor layer; an interlayer insulating layer (22) formed on the second metal layer; and a transparent electrode layer (TE) including a transparent conductive layer (Tc). The oxide semiconductor layer includes a first portion (16a) and a second portion (16b) extending while crossing an edge of the gate electrode. The second metal layer includes a source electrode (18s) and a drain electrode (18d). The interlayer insulating layer does not include an organic insulating layer. The interlayer insulating layer includes a contact hole (22a) formed so as to overlap the second portion and an end of the drain electrode that is closer to the second portion. The transparent conductive layer (Tc) is in contact with the end of the drain electrode and the second portion of the oxide semiconductor layer in the contact hole.

20 Claims, 23 Drawing Sheets

(51) Int. Cl.
*H01L 29/786* (2006.01)
*G02F 1/1362* (2006.01)

(52) U.S. Cl.
CPC ...... *H01L 27/1262* (2013.01); *H01L 27/3248* (2013.01); *H01L 29/7869* (2013.01); *H01L 29/78606* (2013.01); *H01L 29/78696* (2013.01)

(56) References Cited

U.S. PATENT DOCUMENTS

| | | |
|---|---|---|
| 2006/0194500 A1 | 8/2006 | Ishii |
| 2012/0086881 A1* | 4/2012 | Kim .................... H01L 27/1288 349/46 |
| 2012/0138922 A1 | 6/2012 | Yamazaki et al. |
| 2013/0214272 A1* | 8/2013 | Nakatani ............. H01L 27/1225 257/43 |
| 2013/0214273 A1 | 8/2013 | Yamazaki et al. |
| 2014/0175467 A1* | 6/2014 | Choi ................. G02F 1/134363 257/89 |
| 2014/0340607 A1 | 11/2014 | Nakata et al. |

FOREIGN PATENT DOCUMENTS

| | | |
|---|---|---|
| JP | 2013-102171 A | 5/2013 |
| JP | 2013-105136 A | 5/2013 |
| WO | 2012/004958 A1 | 1/2012 |
| WO | 2013/073635 A1 | 5/2013 |

\* cited by examiner

FIG.1
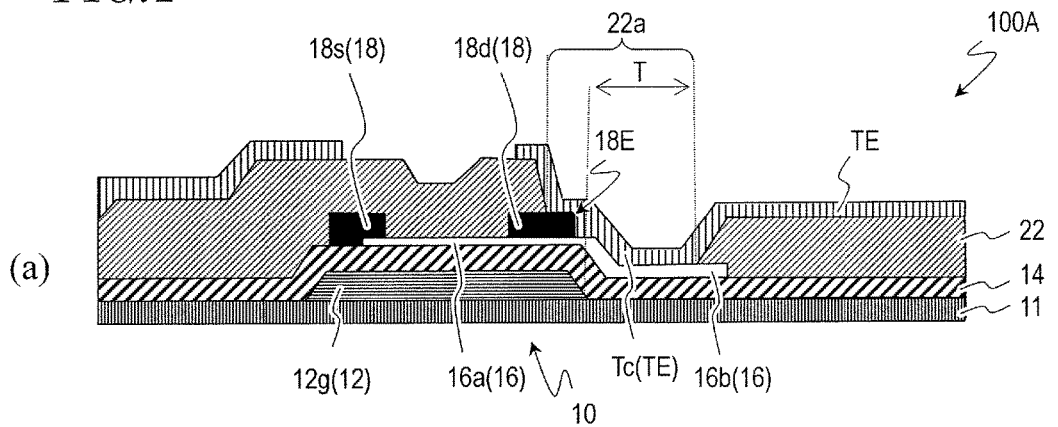
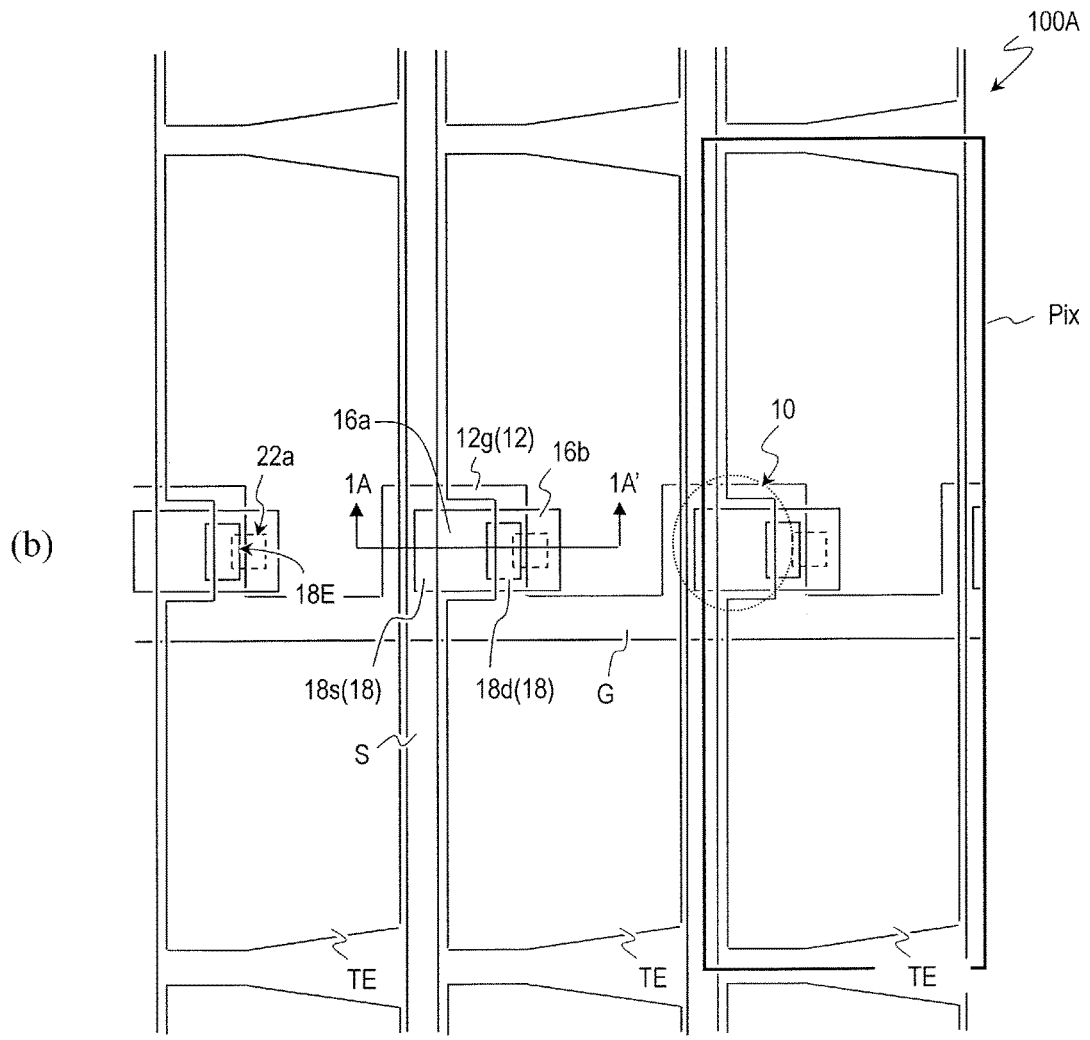

FIG. 7
(a)
(b)
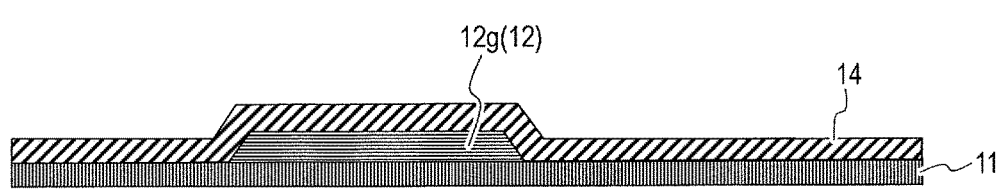
(c)
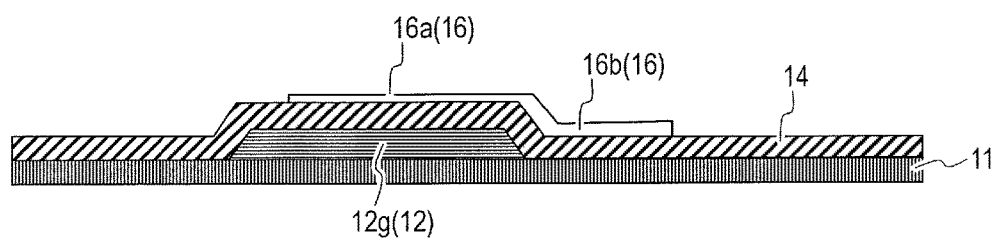
(d)
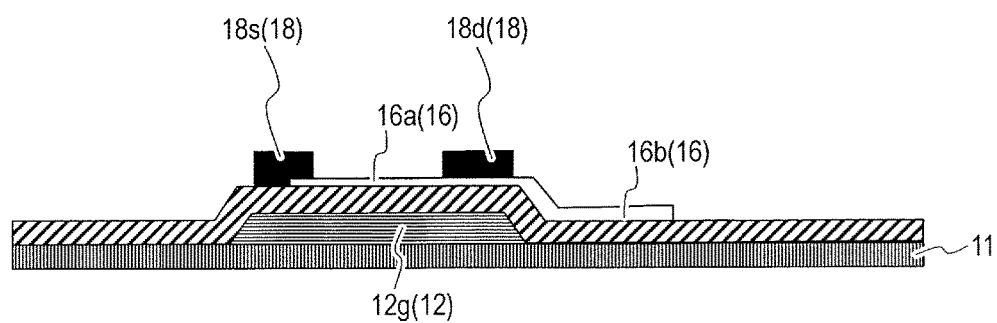

FIG.10
(a)
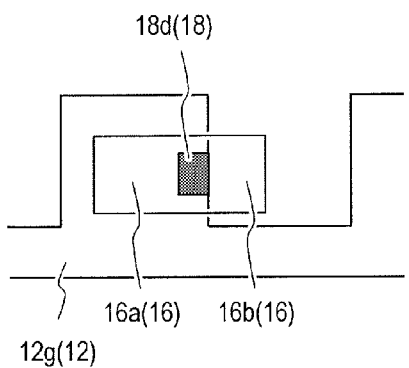
(b)
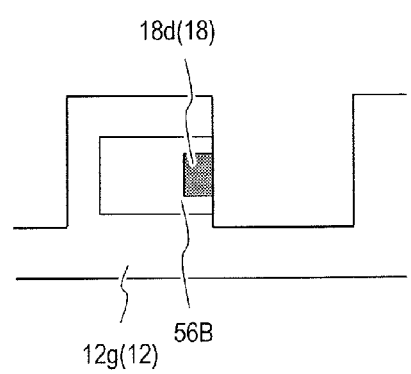
(c)
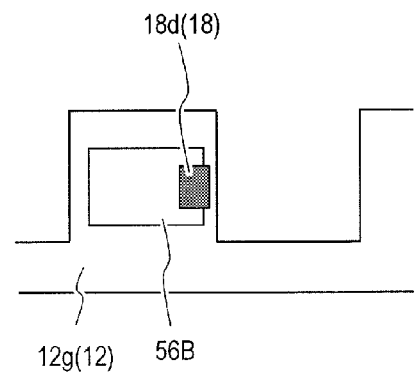
(d)
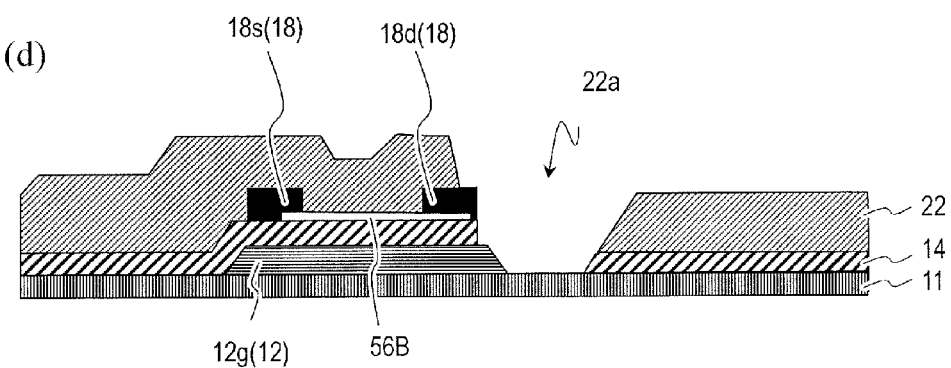

(a)

(b)

FIG.16
(a)
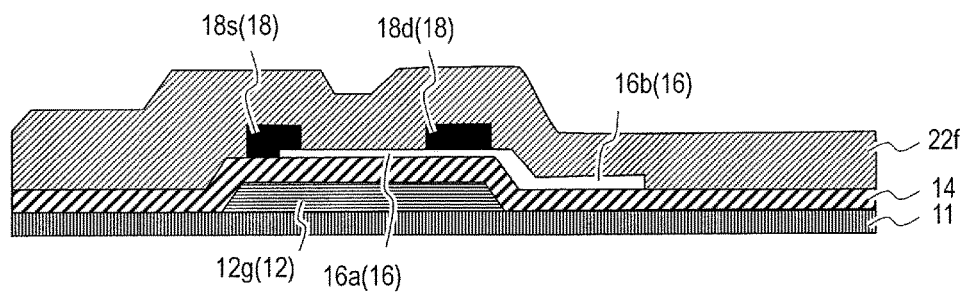
(b)
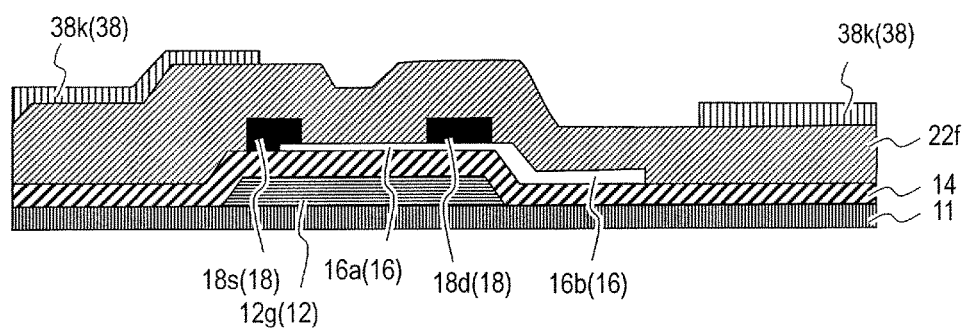
(c)
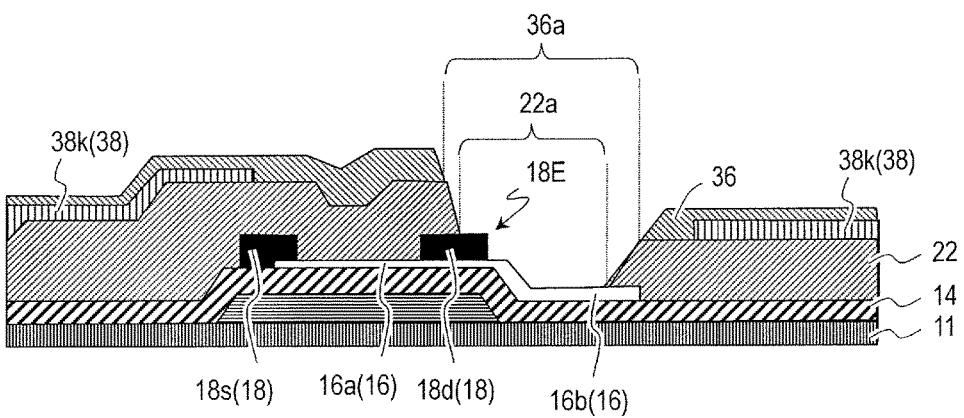

FIG. 18
(a)
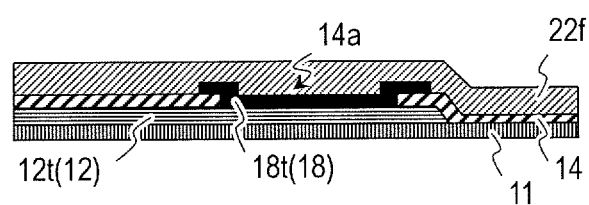
(b)
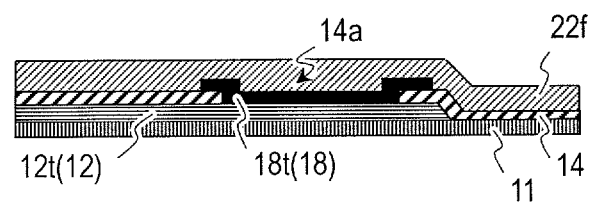
(c)
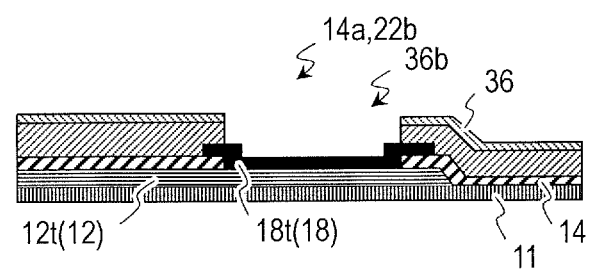

FIG.19
(a)
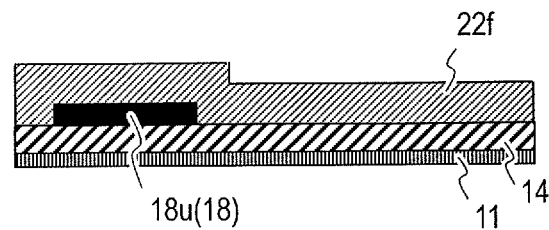
(b)
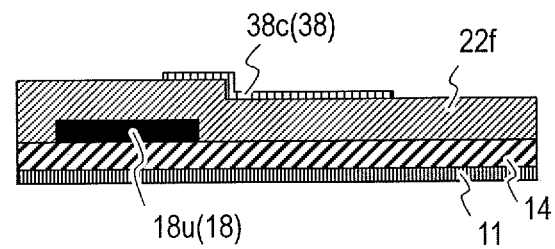
(c)
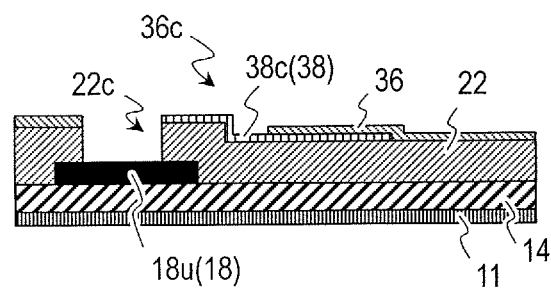

FIG.20
(a)
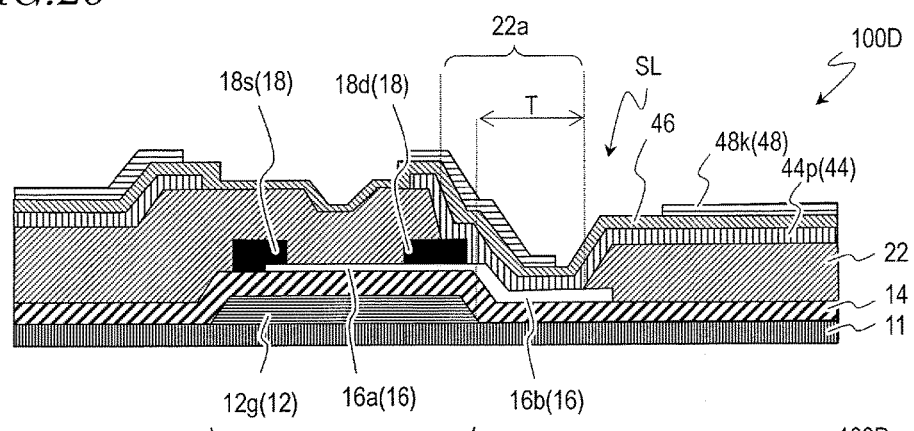
(b)
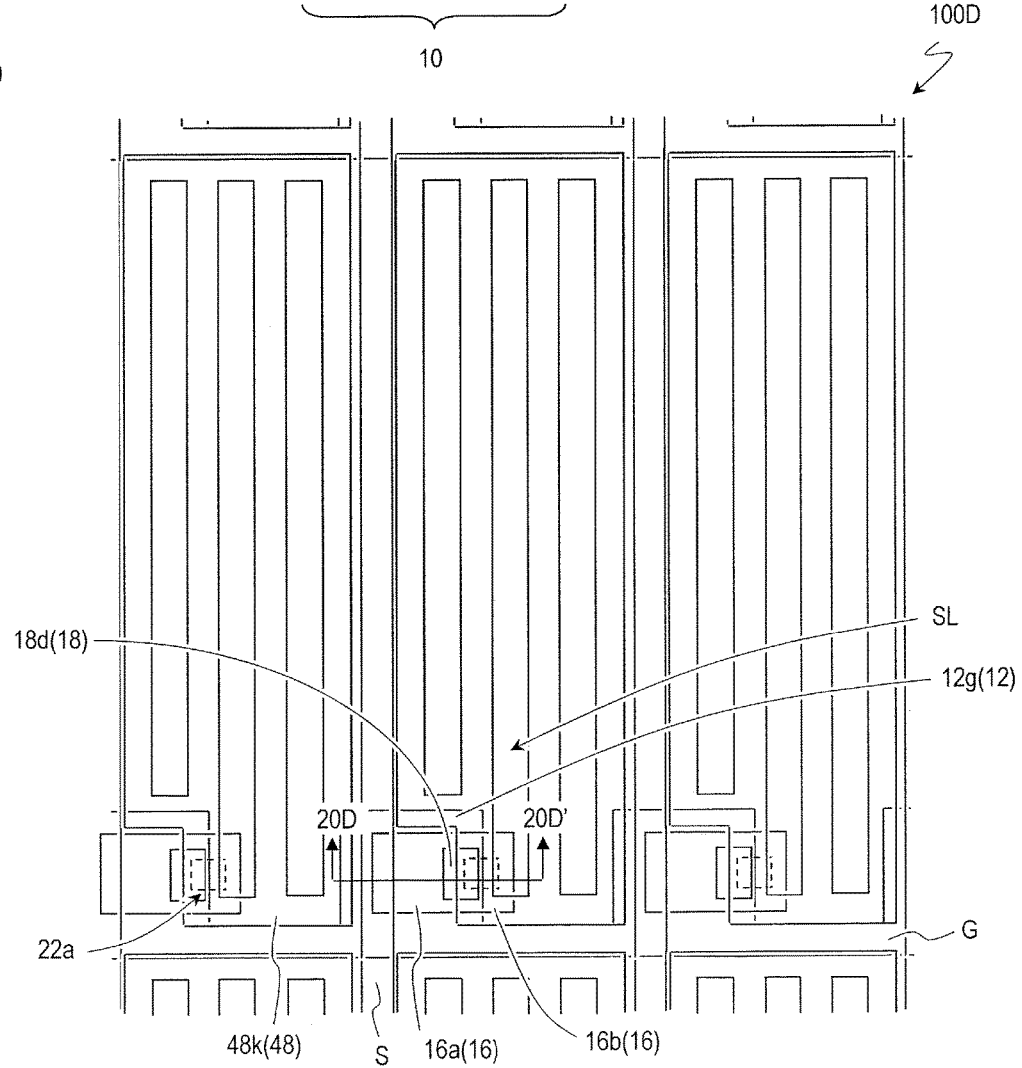

FIG.21
(a) 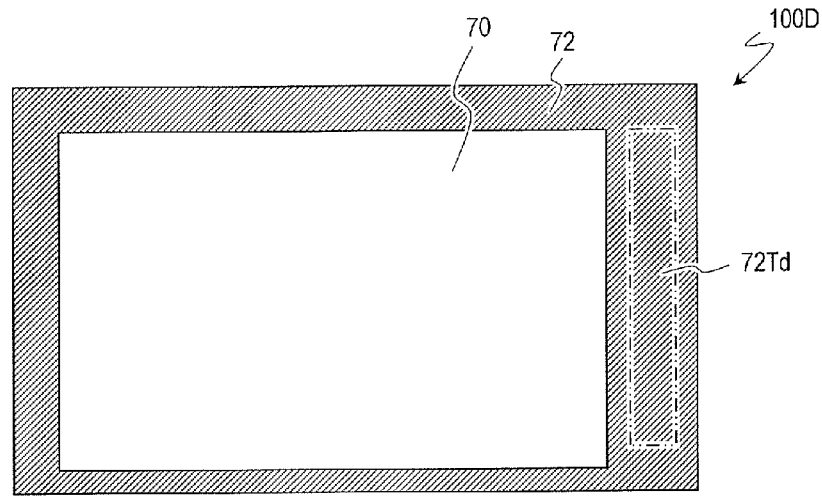
(b) 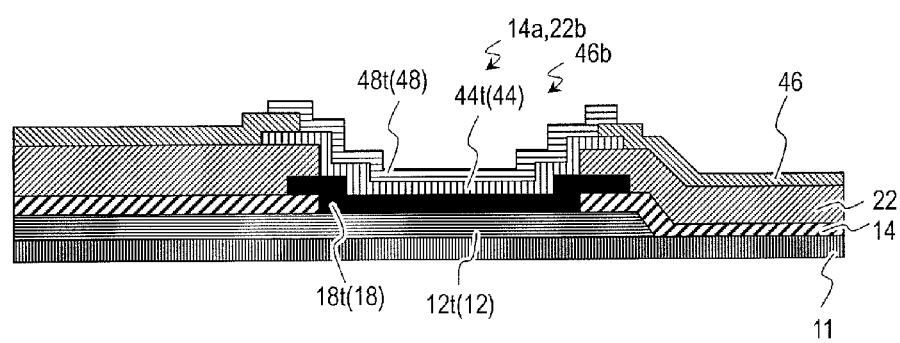
(c) 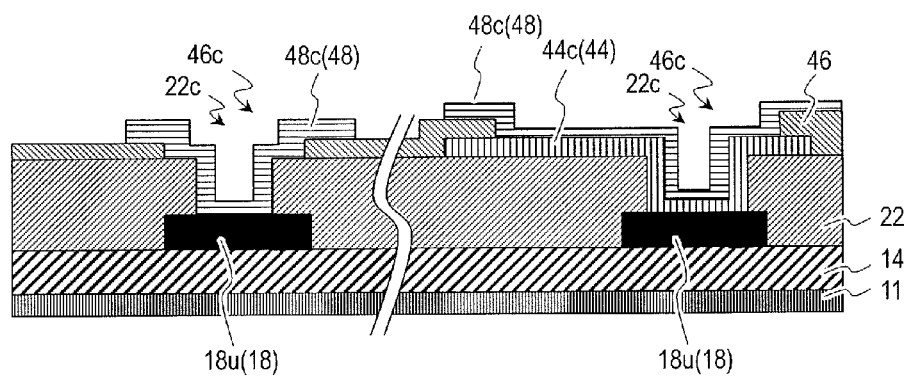

FIG.23
(a)
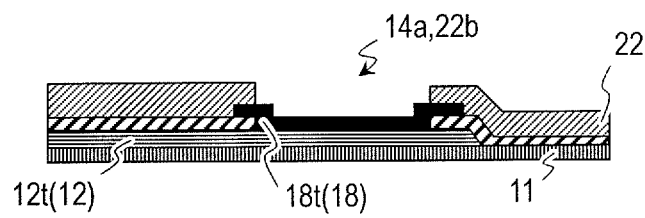
(b)
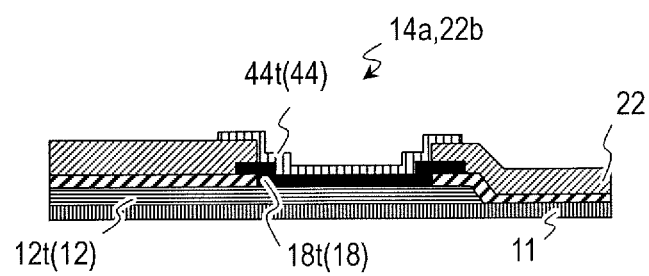
(c)
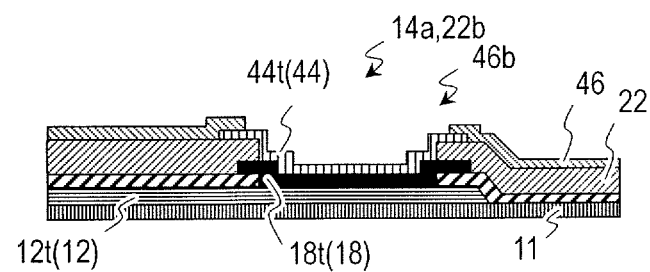

FIG.24
(a)
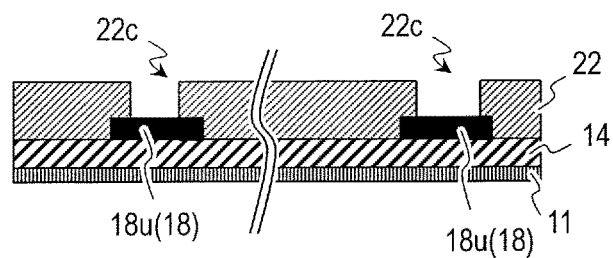
(b)
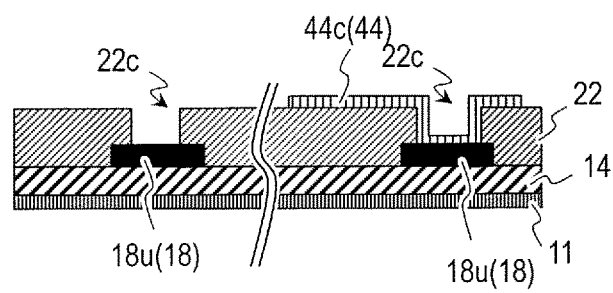
(c)
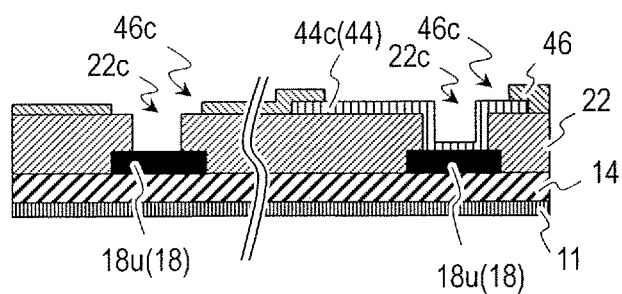

US 9,583,510 B2

SEMICONDUCTOR DEVICE, DISPLAY DEVICE, AND METHOD FOR MANUFACTURING SEMICONDUCTOR DEVICE

TECHNICAL FIELD

The present invention relates to a semiconductor device, a display device, and a method for manufacturing the semiconductor device, and specifically to an active matrix substrate including a thin film transistor (TFT), a display device including the active matrix substrate, and a method for manufacturing the active matrix substrate.

BACKGROUND ART

Display devices including an active matrix substrate that includes a switching element for each of pixels are in wide use. An active matrix substrate including a thin film transistor (hereinafter, referred to as a "TFT") as a switching element is called a "TFT substrate". In this specification, a part of such a TFT substrate corresponding to a pixel of the display device may also be referred to as a "pixel".

A TFT substrate usable for a liquid crystal display device or the like includes, for example, a glass substrate, a plurality of TFTs supported by the glass substrate, gate lines and source lines, and pixel electrodes arrayed in a matrix. A gate electrode of each of the TFTs is electrically connected with a corresponding gate line, a source electrode of each TFT is electrically connected with a corresponding source line, and a drain electrode of each TFT is electrically connected with a corresponding pixel electrode. Usually, the TFTs, the source lines and the gate lines are covered with an interlayer insulating layer, and the pixel electrodes are provided on the interlayer insulating layer and are each connected with a drain electrode of a corresponding TFT in a contact hole formed in the interlayer insulating layer.

As the interlayer insulating layer, an insulating layer formed of an organic insulating material (such an insulating layer is occasionally referred to as an "organic insulating layer") may be used. For example, patent documents 1 and 2 each disclose a TFT substrate including an inorganic insulating layer and an organic insulating layer formed thereon which act together as an interlayer insulating layer covering the TFTs and the lines. An organic insulating material has a dielectric constant lower than that of an inorganic insulating material and tends to be thick when being formed into a layer. Even if an interlayer insulating layer including a relatively thick organic insulating layer (having a thickness of, for example, about 1 μm to 3 μm) is formed and is located such that a peripheral region of the pixel electrode overlaps the gate line and/or the source line with the interlayer insulating layer being provided therebetween, the pixel electrode and the gate line and/or the source line have a small parasitic capacitance formed therebetween. This allows the pixel electrode to be located so as to overlap the gate line or the source line. As compared with the case where the pixel electrode is located so as not to overlap the lines, the numerical apertures of the pixels is improved.

CITATION LIST

Patent Literature

Patent Document 1: Japanese Laid-Open Patent Publication No. 2013-105136

Patent Document 2: International Publication WO2013/073635

SUMMARY OF INVENTION

Technical Problem

However, in the case where a relatively thick organic insulating layer is formed, the contact hole formed in the interlayer insulating layer in order to connect the drain electrode and the pixel electrode with each other is made deep. In the structure in which the contact hole is deep, alignment of liquid crystal molecules in the vicinity of the contact hole is disturbed, which may possibly cause light leak in the vicinity of the contact hole. In addition, a side wall of the contact hole formed in the organic insulating layer is inclined with respect to a line normal to the substrate. Therefore, as the contact hole is deeper, the area size of the opening of the contact hole is larger. In, for example, patent document 1, in order to suppress the light leak in the vicinity of the contact hole, the contact hole is located on the drain electrode, so that an area in the vicinity of the contact hole is shielded against light by the drain electrode (or a portion extended from the drain electrode). In patent document 2, the contact hole is located on the gate electrode (gate line), so that an area in the vicinity of the contact hole is shielded against light. In order to shield the area in the vicinity of the contact hole against light, a sufficiently large light-blocking region needs to be formed in consideration of an alignment error or the like during the manufacturing process. Therefore, in a display device including such a TFT substrate, the area in a pixel contributing to display is smaller by the light-blocking region, which reduces the light utilization efficiency.

As the precision of display devices is improved, the area size of pixels is decreased. Therefore, the reduction of the light utilization efficiency, which is caused by formation of the light-blocking region in the pixels, is made more conspicuous.

An embodiment of the present invention made in light of such a situation has an object of providing a semiconductor device and a display device that suppress the reduction of the light utilization efficiency as compared with a conventional device, and also providing a method for manufacturing such a semiconductor device.

Solution to Problem

A semiconductor device in an embodiment according to the present invention includes a substrate and a thin film transistor supported by the substrate. The semiconductor device includes a first metal layer including a gate electrode of the thin film transistor; a gate insulating layer formed on the first metal layer; an oxide semiconductor layer formed on the gate insulating layer and including an active layer of the thin film transistor, the oxide semiconductor layer including a first portion formed so as to overlap the gate electrode and a second portion extending from the first portion while crossing an edge at one end of the gate electrode; a second metal layer formed on the oxide semiconductor layer and including a source electrode and a drain electrode of the thin film transistor, the drain electrode being located closer to the second portion than the source electrode is; an interlayer insulating layer formed on the second metal layer and including a first contact hole; and a first transparent electrode layer formed on the interlayer insulating layer and in the first contact hole. The interlayer insulating layer does not include an organic insulating layer; the first contact hole is formed so as to overlap the second portion of the oxide semiconductor layer and an end of the drain electrode closer to the second portion, when viewed along a normal to the substrate; and the first transparent electrode layer includes a transparent conductive layer in contact with the end of the drain electrode and the second portion of the oxide semiconductor layer in the first contact hole.

In an embodiment, the semiconductor device further includes a dielectric layer formed on the first transparent electrode layer and including a first opening formed at a position corresponding to the first contact hole; and a second transparent electrode layer formed on the dielectric layer and in the first opening. The first transparent electrode layer includes a first electrode not electrically connected with the transparent conductive layer; and the second transparent electrode layer includes a second electrode in contact with the transparent conductive layer in the first opening.

In an embodiment, the first electrode faces the second electrode with the dielectric layer being provided between the first electrode and the second electrode.

In an embodiment, the semiconductor device includes a plurality of pixels. The plurality of pixels each include the thin film transistor, the first electrode and the second electrode; the first electrode acts as a common electrode; and the second electrode acts as a pixel electrode.

In an embodiment, the second metal layer includes an upper line layer; the first transparent electrode layer includes a first transparent connection layer electrically connected with the first electrode; the second transparent electrode layer includes a second transparent connection layer; the interlayer insulating layer includes a second contact hole; the second contact hole is formed so as to overlap the upper line layer when viewed along a normal to the substrate; the dielectric layer includes a second opening formed at a position corresponding to the second contact hole; and the second transparent connection layer is in contact with the upper line layer in the second contact hole and is in contact with the first transparent connection layer in the second opening.

In an embodiment, the second metal layer includes an upper line layer; the first transparent electrode layer includes a first transparent connection layer electrically connected with the first electrode; the interlayer insulating layer includes a second contact hole; the second contact hole is formed so as to overlap the upper line layer when viewed along a normal to the substrate; and the first transparent connection layer is in contact with the upper line layer in the second contact hole.

In an embodiment, the semiconductor device includes a plurality of pixels. The plurality of pixels each include the thin film transistor and the transparent conductive layer; and the transparent conductive layer acts as a pixel electrode.

In an embodiment, the semiconductor device further includes a dielectric layer located between the interlayer insulating layer and the first transparent electrode layer; and a second transparent electrode layer located between the interlayer insulating layer and the dielectric layer. The second transparent electrode layer includes a transparent electrode not electrically connected with the transparent conductive layer.

In an embodiment, the transparent electrode acts as a common electrode.

In an embodiment, the second metal layer includes an upper line layer; the first transparent electrode layer includes a first transparent connection layer; the second transparent electrode layer includes a second transparent connection layer electrically connected with the transparent electrode; the interlayer insulating layer includes a second contact hole; the second contact hole is formed so as to overlap the upper line layer when viewed along a normal to the substrate; the dielectric layer includes an opening formed at a position corresponding to the second contact hole; and the first transparent connection layer is in contact with the upper line layer in the second contact hole and is in contact with the second transparent connection layer in the opening.

In an embodiment, the semiconductor device further includes a dielectric layer covering the first transparent electrode layer; and a second transparent electrode layer formed on the dielectric layer. The second transparent electrode layer includes a transparent electrode not electrically connected with the transparent conductive layer, and the transparent electrode acts as a common electrode.

In an embodiment, the second metal layer includes an upper line layer; the interlayer insulating layer includes a second contact hole; the second contact hole is formed so as to overlap the upper line layer when viewed along a normal to the substrate; the dielectric layer includes an opening formed at a position corresponding to the second contact hole; the second transparent electrode layer includes a transparent connection layer electrically connected with the transparent electrode; and the transparent connection layer is in contact with the upper line layer in the second contact hole in the opening.

In an embodiment, the second metal layer includes an upper line layer; the interlayer insulating layer includes a second contact hole; the second contact hole is formed so as to overlap the upper line layer when viewed along a normal to the substrate; the dielectric layer includes an opening formed at a position corresponding to the second contact hole; the first transparent electrode layer includes a first transparent connection layer not electrically connected with the transparent conductive layer; the second transparent electrode layer includes a second transparent connection layer electrically connected with the transparent electrode; the first transparent connection layer is in contact with the upper line layer in the second contact hole; and the second transparent connection layer is in contact with the first transparent connection layer in the opening.

In an embodiment, the oxide semiconductor layer contains an In—Ga—Zn—O-type semiconductor.

In an embodiment, the In—Ga—Zn—O-type semiconductor contains a crystalline portion.

A display device in an embodiment according to the present invention includes any of the above-described the semiconductor devices; a counter substrate located so as to face the semiconductor device; and a liquid crystal layer located between the counter substrate and the semiconductor device.

A method for manufacturing a semiconductor device in an embodiment according to the present invention includes step (a) of forming a first metal layer including a gate electrode on a substrate; step (b) of forming a gate insulating layer covering the first metal layer; step (c) of forming an oxide semiconductor layer on the gate insulating layer, the oxide semiconductor layer including a first portion formed so as to overlap the gate electrode and a second portion extending from the first portion while crossing an edge at one end of the gate electrode; step (d) of forming a second metal layer on the oxide semiconductor layer, the second metal layer including a source electrode and a drain electrode located closer to the second portion than the source electrode is; step (e) of forming an interlayer insulating film on the second metal layer, the interlayer insulating film not including an organic insulating film; step (f) of etching the interlayer insulating film to form a contact hole exposing a surface of the second portion of the oxide semiconductor layer and an end of the drain electrode that is closer to the second portion; and step (g) of forming a transparent conductive layer in contact with the end of the drain electrode and the surface of the second portion of the oxide semiconductor layer in the contact hole.

In an embodiment, in step (f), the interlayer insulating film is etched using the oxide semiconductor layer as an etching stopper.

In an embodiment, the oxide semiconductor layer contains an In—Ga—Zn—O-type semiconductor.

In an embodiment, the In—Ga—Zn—O-type semiconductor contains a crystalline portion.

Advantageous Effects of Invention

An embodiment of the present invention provides a semiconductor device and a display device that suppress the reduction of the light utilization efficiency as compared with a conventional device, and also providing a method for manufacturing such a semiconductor device.

BRIEF DESCRIPTION OF DRAWINGS

FIG. 1(a) is a schematic cross-sectional view of a TFT substrate 100A, in embodiment 1 according to the present invention, and FIG. 1(b) is a schematic plan view of the TFT substrate 100A.

FIG. 7(a) through FIG. 7(d) are each a schematic cross-sectional view showing a step for forming the TFT portion of the TFT substrate 100B.

FIG. 10(a) through 10(c) are each a plan view schematically showing an example of arrangement of a gate electrode 12g, an oxide semiconductor layer 16 and a drain electrode 18d, and FIG. 10(d) is a schematic cross-sectional view showing an inconvenience which occurs when the oxide semiconductor layer does not include a second portion.

FIG. 16(a) through FIG. 16(c) are each a schematic cross-sectional view showing a step for forming the TFT portion of the TFT substrate 100C.

FIG. 18(a) through FIG. 18(c) are each a schematic cross-sectional view showing a step for forming the terminal portion 72Tc of the TFT substrate 100C.

FIG. 19(a) through FIG. 19(c) are each a schematic cross-sectional view showing a step for forming the S-COM connection portion of the TFT substrate 100C.

FIG. 20(a) is a schematic cross-sectional view of a TFT substrate 100D as a modification of the TFT substrate 100C, and FIG. 20(b) is a schematic plan view of the TFT substrate 100D.

FIG. 21(a) schematically shows an example of planar structure of the TFT substrate 100D, FIG. 21(b) is a schematic cross-sectional view of a terminal included in a terminal portion 72Td, and FIG. 21(c) is a schematic cross-sectional view of an S-COM connection portion.

FIG. 23(a) through FIG. 23(c) are each a schematic cross-sectional view showing a step for forming the terminal portion 72Td of the TFT substrate 100d.

FIG. 24(a) through FIG. 24(c) are each a schematic cross-sectional view showing a step for forming the S-COM connection portion of the TFT substrate 100D.

DESCRIPTION OF EMBODIMENTS

Figure 2:
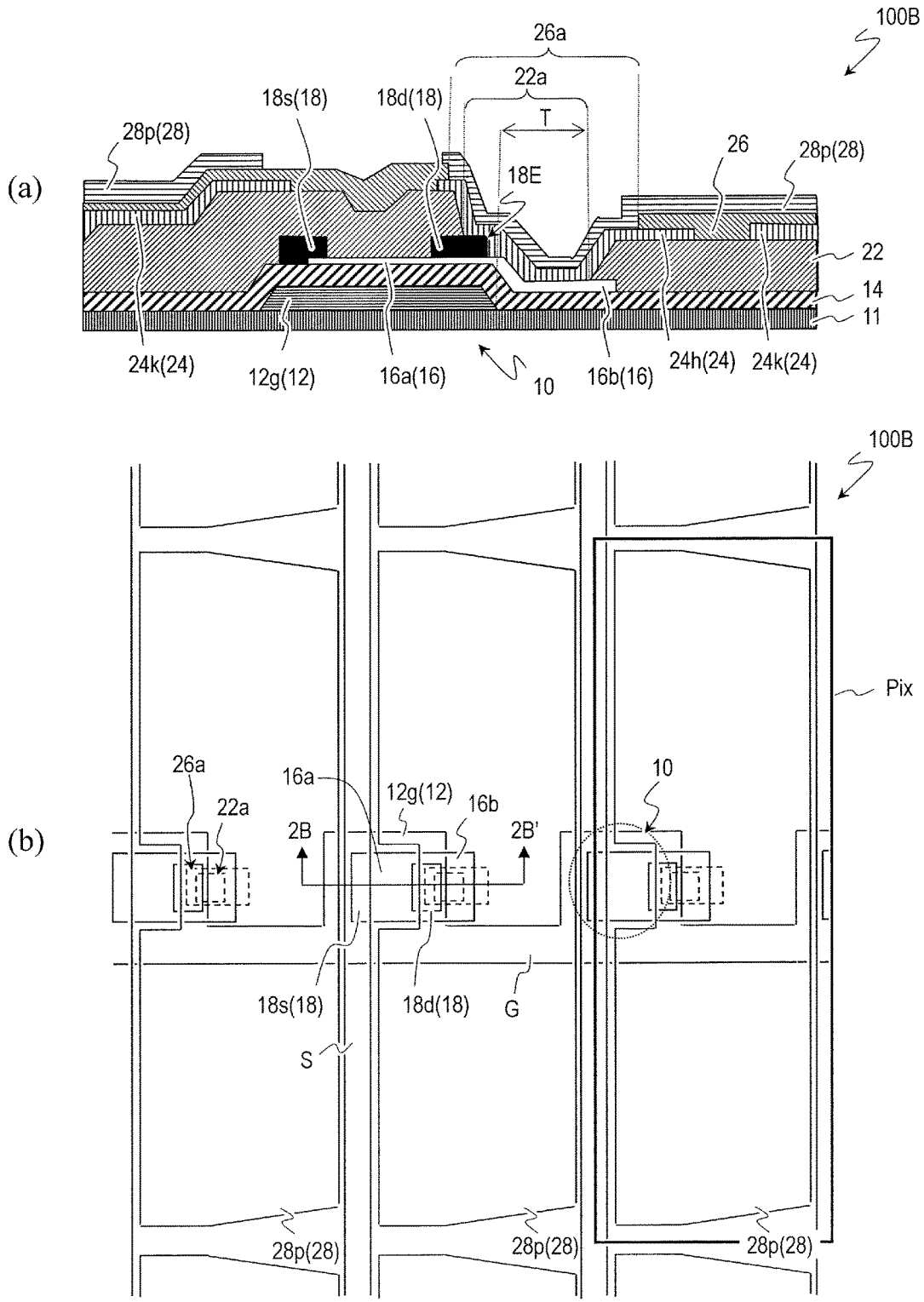
FIG. 2(a) is a schematic cross-sectional view of a TFT substrate 100B in embodiment 2 according to the present invention.
FIG. 2(b) is a schematic plan view of the TFT substrate 100B.

Hereinafter, a semiconductor device, a display device and a method for manufacturing the semiconductor device in embodiments of the present invention will be described with reference to the drawings. The present invention is not limited to any of the following embodiments provided as examples. In the following description, a TFT substrate usable for a liquid crystal display device is provided as a semiconductor device, but the semiconductor device in an embodiment according to the present invention encompasses a TFT substrate of any other transmission-type display device (e.g., electrophoresis-type display device, a MEMS (Micro-Electro-Mechanical Type) display device, an organic EL (electroluminescence) display device).

First, a structure of a TFT substrate 100A in an embodiment according to the present invention will be described with reference to FIG. 1. In the following description, elements having substantially the same functions will bear the same reference signs, and descriptions thereof may be omitted.

FIG. 1 schematically shows a structure of the TFT substrate 100A in embodiment 1 according to the present invention. FIG. 1(a) is a schematic cross-sectional view, and FIG. 1(b) is a schematic plan view.

As shown in FIG. 1(b), the TFT substrate 100A includes pixels Pix respectively corresponding to pixels of a liquid crystal display device that is to be manufactured using the TFT substrate 100A. The pixels Pix are arrayed in a matrix including rows and columns, and forma display region. The TFT substrate 100A includes source lines S extending in a column direction, gate lines G extending in a row direction, TFTs 10, and transparent electrode layers TE. FIG. 1(a) is a cross-sectional view taken along line 1A-1A' in FIG. 1(b).

As shown in FIG. 1(a), the TFT substrate 100A includes a substrate (e.g., glass substrate) 11, the TFT 10 supported by the substrate 11, a first metal layer 12 including a gate electrode 12g of the TFT 10, a gate insulating layer 14 formed on the first metal layer 12, and an oxide semiconductor layer 16 formed on the gate insulating layer 14. The oxide semiconductor layer 16 includes an active layer of the TFT 10. The oxide semiconductor layer 16 includes a first portion 16a formed so as to overlap the gate electrode 12g and a second portion 16b extending from the first portion 16a while crossing an edge at one end of the gate electrode 12g.

The TFT substrate 100A also includes a second metal layer 18 formed on the oxide semiconductor layer 16. The second metal layer 18 includes a source electrode 18s and a drain electrode 18d of the TFT 10. The drain electrode 18d is located closer to the second portion 16b of the oxide semiconductor layer 16 than the source electrode 18s is.

In this specification, the term "metal layer" refers to a conductive layer. A "metal layer" is not limited to being a layer formed of a metal material, and may be a layer formed of, for example, a metal nitride or a metal oxide. A "metal layer" is not limited to being a single layer, and may include a stack of a plurality of layers. The first metal layer 12 and the second metal layer 18 include a layer formed of a metal material and block light. The first metal layer 12 and the second metal layer 18, which include a layer formed of a metal material, is more highly conductive than a common transparent conductive layer. Therefore, the first metal layer 12 and the second metal layer 18 may have a narrower width as lines and thus contribute to improvement in the precision and the numerical aperture of the pixels.

The TFT substrate 100A further includes an interlayer insulating layer 22 formed on the second metal layer 18, and the transparent electrode layer TE. The interlayer insulating layer 22 is formed of an inorganic insulating material, and does not include an organic insulating layer. The interlayer insulating layer 22 may have a stack structure. The interlayer insulating layer 22 includes a contact hole 22a. As shown in FIG. 1(b), the contact hole 22a is formed so as to overlap the second portion 16b of the oxide semiconductor layer 16 and an end 18E, of the drain electrode 18d, closer to the second portion 16b, when viewed along a normal to the substrate 11. Therefore, when viewed along a normal to the substrate 11, the end 18E of the drain electrode 18b is located in the contact hole 22a. In the example shown in FIG. 1, when viewed along a normal to the substrate 11, the entirety of the contact hole 22a is located so as to overlap the oxide semiconductor layer 16, and the contact hole 22a is formed so as to expose a top surface of the second portion 16b of the oxide semiconductor layer 16 and the end 18E of the drain electrode 18d.

The transparent electrode layer TE is formed on the interlayer insulating layer 22 and in the contact hole 22a, and includes a transparent conductive layer Tc, which is in contact with the end 18E of the drain electrode 18d and the second portion 16b of the oxide semiconductor layer 16 in the contact hole 22a. In more detail, as shown in FIG. 1(a), the transparent conductive layer Tc is in contact with a top surface of the drain electrode 18d in the vicinity of the end 18E and a side surface of the drain electrode 18d in the contact hole 22a. Because of this structure, the transparent conductive layer Tc is electrically connected with the drain electrode 18d and acts as a pixel electrode. An alignment film (not shown) is formed on the transparent conductive layer Tc (on the side opposite to the substrate 11). The TFT substrate 100A is usable for, for example, a liquid crystal display device of a vertical electric field mode such as a TN (Twisted Nematic) mode, a VA (Vertical Alignment) mode or the like.

In the TFT substrate 100A, a part of a region defined by the contact hole 22a (opening region of the contact hole 22a) is not shielded against light by the gate electrode 12g or the drain electrode 18d, and this part is usable as a light-transmissive region T. The TFT substrate 100A does not include an organic insulating layer, and thus the contact hole 22a is relatively shallow. Therefore, the alignment of the liquid crystal molecules is not much disturbed by the contact hole 22a, and thus much light does not leak in the vicinity of the contact hole 22a. Provision of the light-transmissive region T in the opening region of the contact hole 22a improves the light utilization efficiency as compared with in a conventional device.

The TFT substrate 100A may be modified in various manners. For example, another transparent conductive layer acting as a storage capacitance electrode may be provided on the transparent conductive layer (pixel electrode) Tc on the substrate 11 side, with a dielectric layer being provided between the another transparent conductive layer and the transparent conductive layer Tc. Alternatively, another transparent conductive layer acting as a common electrode may be provided on the transparent conductive layer (pixel electrode) Tc on the substrate 11 side or on the side of a liquid crystal layer, so that the TFT substrate 100A is applicable to a liquid crystal display device of an FFS (Fringe Field Switching) mode.

The transparent conductive layer Tc may not be a pixel electrode. For example, a pixel electrode may be provided above the transparent electrode layer TE (on the liquid crystal layer side), so that the transparent conductive layer Tc acts as a connection portion that connects the pixel electrode and the drain electrode 18d of the TFT 10 with each other. In this case, the transparent electrode layer TE may include a common electrode electrically insulated from the transparent electrode layer Tc.

In the following embodiments, modifications of the TFT substrate 100A will be described. The TFT substrates in the following embodiments each include the structure of the TFT substrate 100A.

Now, with reference to FIG. 2, a TFT substrate 100B in embodiment 2 according to the present invention will be described.

FIG. 2(a) is a schematic cross-sectional view of the TFT substrate 100B in embodiment 2 according to the present invention. The TFT substrate 100B shown in FIG. 2(a) may be the same as the TFT substrate 100A shown in FIG. 1 except for further including a dielectric layer 26 formed on a lower transparent electrode layer 24 and an upper transparent electrode layer 28. In FIG. 2(a), the lower transparent electrode layer 24 may be regarded as corresponding to the transparent electrode layer TE of the TFT substrate 100A and a connection portion 24h may be regarded as corresponding to the transparent conductive layer Tc of the TFT substrate 100A. The upper transparent electrode layer 28 includes a pixel electrode 28p. An alignment film (not shown) may be formed on the upper transparent electrode layer 28. As shown in FIG. 2(a), the dielectric layer 26 includes an opening 26a at a position corresponding to the contact hole 22a formed in the interlayer insulating layer 22, and the upper transparent electrode layer 28 is formed on the dielectric layer 26 and in the opening 26a. As described later, the dielectric layer 26 is formed of an inorganic insulating material.

In the structure shown in FIG. 2(a) as an example, the lower transparent electrode layer 24 includes a transparent electrode 24k formed on the interlayer insulating layer 22. The transparent electrode 24k is formed of the same transparent conductive film as that of the connection portion 24h. The transparent electrode 24k is not electrically connected with (electrically separated from) the connection portion 24h.

As shown in FIG. 2(a), the pixel electrode 28p is in contact with the connection portion 24h in the opening 26a. Namely, the pixel electrode 28p is electrically connected with the drain electrode 18d of the TFT 10 via the connection portion 24h. In the TFT substrate 100B, the connection portion 24h acts as a conductive layer that electrically connects the drain electrode 18d and the pixel electrode 28p with each other.

In the TFT substrate 100B, at least a part of the pixel electrode 28p is located so as to overlap (so as to face) the transparent electrode 24k with the dielectric layer 26 being provided therebetween. Because of this structure, a storage capacitance having the transparent electrode 24k as a storage capacitance electrode is formed in a portion where the pixel electrode 28p and the transparent electrode 24k overlap each other. In the case where a storage capacitance is formed by a two-layer electrode structure including two transparent conductive layers sandwiching an inorganic insulating layer as described above, it is not necessary to provide a storage capacitance electrode formed of the same metal layer or the like as that of, for example, the source line. This decreases the area size of the light-blocking region. Therefore, the reduction of the light utilization efficiency, which is caused by providing a storage capacitance in a pixel, is suppressed. The transparent electrode 24k may be adapted so as to act as a common electrode. A structure for supplying a common signal (COM signal) to the transparent electrode 24k will be described later.

In the TFT substrate 100B, a two-layer electrode structure including the transparent electrode (common electrode) 24k and the pixel electrode 28p may be formed, so that a liquid crystal display device of an FSS mode is realized. As can be seen, the transparent electrode 24k may act as a storage capacitance electrode or act as a common electrode. Alternatively, the transparent electrode 24k may act as both of a storage capacitance electrode and a common electrode.

FIG. 2(b) is a schematic plan view of the TFT substrate 100B. FIG. 2(a) is a cross-sectional view taken along line 2B-2B' in FIG. 2(b). In the following description, the TFT and an area around the TFT located in correspondence with each of the plurality of pixels may be referred to as a "TFT portion". An element that connects the pixel electrode and the drain electrode of the TFT with each other using the contact hole may be referred to as a "contact portion".

The TFTs 10 are each located in the vicinity of a point at which a corresponding source line S and a corresponding gate line G cross each other. The gate electrode 12g of each TFT 10 is electrically connected with the corresponding gate line G, and the source electrode 18s of each TFT 10 is electrically connected with the corresponding source line S. The gate line G is formed in the same metal layer as the gate electrode 12g (formed in the first metal layer 12), and the source line S is formed in the same metal layer as the source electrode 18s (formed in the second metal layer 18). As shown in the figure, the gate line G and the gate electrode 12g may be integrally formed. Similarly, the source line S and the source electrode 18s may be integrally formed.

Hereinafter, an effect provided by the TFT substrate 100B in this embodiment will be described as being compared with a TFT substrate, in a reference example, that includes an interlayer insulating layer including an organic insulating layer.

Figure 3:
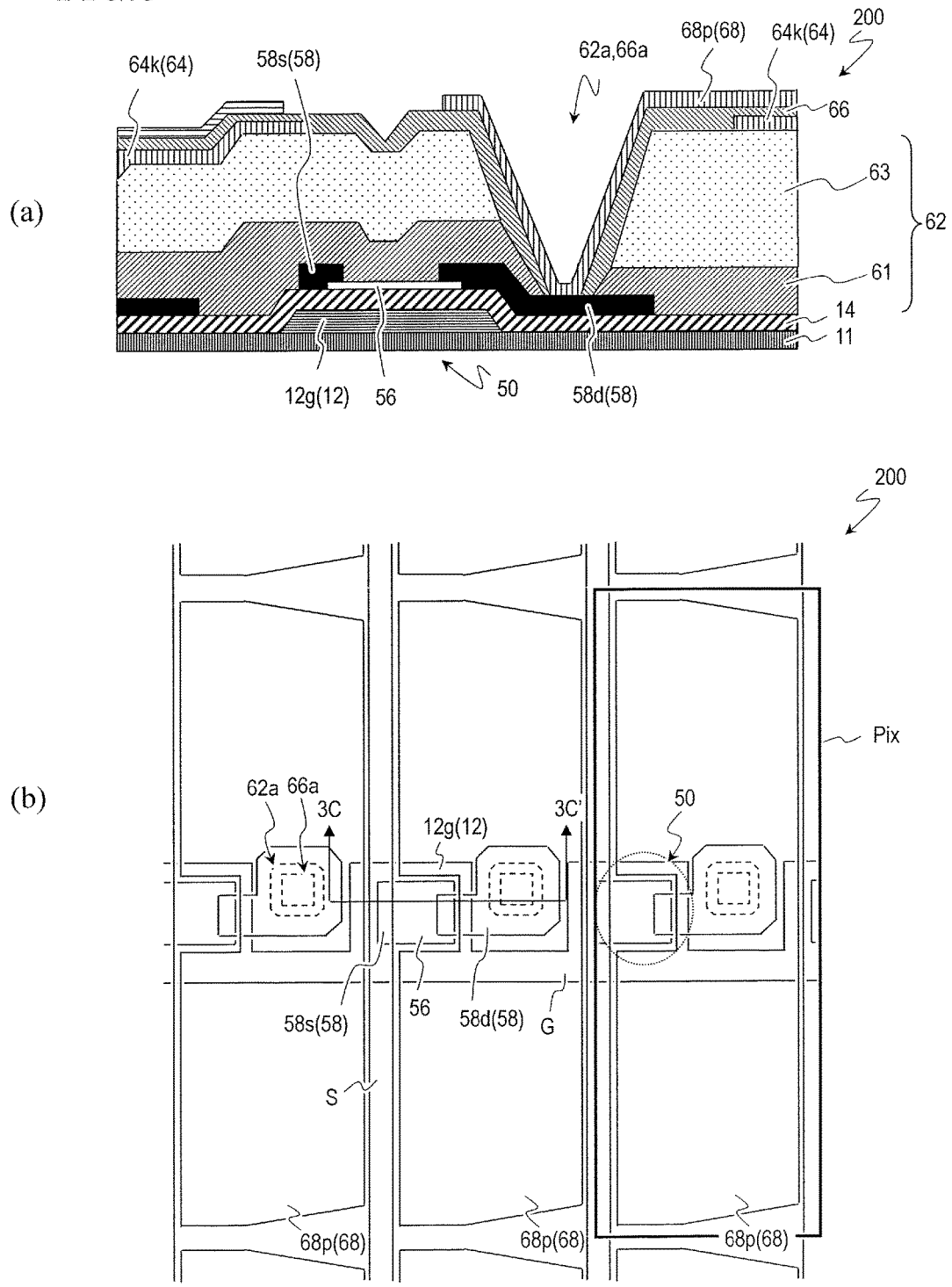
FIG. 3(a) and FIG. 3(b) are respectively a schematic cross-sectional view and a schematic plan view of a TFT substrate 200 in a reference example.

FIG. 3(a) and FIG. 3(b) are respectively a schematic cross-sectional view and a schematic plan view of a TFT substrate 200 in the reference example. FIG. 3(a) is a cross-sectional view taken along line 3C-3C' in FIG. 3(b).

In the TFT substrate 200 in the reference example, a second metal layer 58 includes a source electrode 58s and a drain electrode 58d. The drain electrode 58d, which is electrically connected with a semiconductor layer 56 of a TFT 50, includes a portion extending while crossing an edge of the gate electrode 12g when viewed along a normal to the substrate 11. An interlayer insulating layer 62 is formed on the second metal layer 58. The interlayer insulating layer 62 has a stack structure including an inorganic insulating layer 61 and an organic insulating layer 63 formed on the inorganic insulating layer 61. On the interlayer insulating layer 62, a first transparent electrode layer 64 including a transparent electrode 64k, a dielectric layer 66 and a second transparent electrode layer 68 are formed in this order.

The interlayer insulating layer 62 includes a contact hole 62 exposing a top surface of the drain electrode 58d. When viewed along a normal to the substrate 11, the entirety of the contact hole 62a is located so as to overlap the drain electrode 58d. The first transparent electrode layer 64 includes an opening, and the contact hole 62a is located in the opening of the first transparent electrode layer 64. Therefore, the first transparent electrode layer 64 does not include a portion overlapping the drain electrode 58d in the contact hole 62a. The dielectric layer 66 is formed on the interlayer insulating layer 62, on the first transparent electrode layer 64 and in the contact hole 62a. The dielectric layer 66 includes an opening 66a exposing a surface of the drain electrode 58d in the contact hole 62a. The second transparent electrode layer 68 includes a pixel electrode 68p in contact with the drain electrode 58d in the opening 66a. In the example shown in FIG. 3(a), a part of the pixel electrode 68p and the transparent electrode 64k face each other while having the dielectric layer 66 therebetween, so that a two-layer electrode structure is formed.

In the TFT substrate 200 in the reference example, the opening region of the contact hole 62 is entirely shielded against light by the drain electrode 58d. A reason for this will be described below.

In the TFT substrate 200, the organic insulating layer 63 is included in the interlayer insulating layer 62 in order to decrease the parasitic capacitance caused by the structure in which the transparent electrode 64k (or the pixel electrode 68p) overlaps the source line S and/or the gate line G.

However, since the organic insulating layer 63 is relatively thick, the interlayer insulating layer 62 is also relatively thick and the contact hole 62 is deep. In the case where the TFT substrate 200 is applied to a liquid crystal display device, the alignment of the liquid crystal molecules caused by the contact hole 62a is much disturbed because the contact hole 62a is deep as described above. This may cause light leak. In order to suppress the light leak, the opening region of the contact hole 62a is entirely shielded against light. As a result, in the TFT substrate 200, the area size ratio of the light-blocking region with respect to the pixel Pix is increased, and thus the light utilization efficiency is reduced.

By contrast, in the TFT substrate 100B, the contact hole 22a is located so as to expose the end 18E of the drain electrode 18d. In other words, when viewed along a normal to the substrate 11, a part of the opening region of the contact hole 22a does not overlap the drain electrode 18d. The contact hole 22a is located so as to overlap the part of the oxide semiconductor layer 16 extending while crossing the edge at one end of the gate electrode 12g (so as to overlap the second portion 16b). The oxide semiconductor layer 16 is transparent. Because of this structure, when viewed along a normal to the substrate 11, the opening region of the contact hole 22a has a part not overlapping the gate electrode 12g or the drain electrode 18d. Therefore, such a part T of the opening region of the contact hole 22a is not shielded against light by, for example, the drain electrode 18d or the gate electrode 12g, and may contribute to display as a light-transmissive region. As a result, the light utilization efficiency is improved as compared with in the TFT substrate 200 in the reference example. In addition, since the interlayer insulating layer 22 does not include an organic insulating layer, the light transmittance is increased.

In the embodiment according to the present invention, the power consumption of backlight is decreased, so that the power consumption of the display device is decreased. As described above, in the TFT substrate 100B, the area size ratio of the light-blocking region with respect to the pixel Pix is lower than that of the TFT substrate 200. Therefore, even if the power consumption of backlight is decreased, brightness equivalent to display in a conventional device is realized. In the TFT substrate 100B, the interlayer insulating layer 22 does not include an organic insulating layer, which is formed to be relatively thick, and is thinner than the interlayer insulating layer 62 of the TFT substrate 200. Therefore, in the TFT substrate 100B, the parasitic capacitance caused by the structure in which the transparent electrode (or the pixel electrode) overlaps and the soured line S and/or the gate line G is larger than in the TFT substrate 200. This easily causes signal delay. In the TFT substrate 100B, the power consumption of a driver chip may be set to be high in order to reduce the influence of the signal delay. However, according to the studies of the present inventors, the increase in the power consumption of the driver chip is sufficiently smaller than the power consumption of the backlight (½ or less). Even if the power consumption of the driver chip is set to be high, the power consumption of the entire display device is decreased.

Now, a reason why the entire opening region of the contact hole 22a does not need to be shielded against light in the TFT substrate 100B will be described.

The interlayer insulating layer 22 of the TFT substrate 100B is formed of only an inorganic insulating material, and is thinner than the interlayer insulating layer 62 in the reference example. Therefore, it is not necessary to form a deep contact hole in order to electrically connect the drain electrode 18d and the connection portion 24h with each other. In addition, since the interlayer insulating layer 22 is thinner, the contact hole 22a may have a shorter diameter. Therefore, as compared with in the TFT substrate 200 in the reference example, the light leak caused by the disturbance of the alignment of the liquid crystal molecules in the vicinity of the contact hole is suppressed. For this reason, high display characteristics are realized without shielding the entire opening region of the contact hole 22a against light by, for example, the drain electrode 18d or the gate electrode 12g.

In the TFT substrate 100B shown in FIG. 2, light incident on the part T of the opening region of the contact hole 22a from the substrate 11 side is transmitted through the stack of the second portion 16b of the oxide semiconductor layer 16, the connection portion 24h and the pixel electrode 28p, and goes out toward the liquid crystal layer (not shown). The structure of the contact portion is not limited to the structure shown in FIG. 2(a). As described later, in an embodiment, the pixel electrode is located so as to be in direct contact with the drain electrode 18d and the second portion 16b of the oxide semiconductor layer 16 in the contact hole. In such a contact portion, at least a part of the light incident on the opening region of the contact hole from the substrate 11 side is transmitted through the stack of the second portion 16b of the oxide semiconductor layer 16 and the pixel electrode, and goes out toward the liquid crystal layer (not shown).

When viewed along a normal to the substrate 11, the area size ratio of the drain electrode 18d with respect to the opening region of the contact hole 22a is preferably smaller than the area size ratio of the oxide semiconductor layer 16. The contact area size of the connection portion 24h and the top surface of the drain electrode 18d in the contact hole 22a is preferably smaller than the contact area size of the connection portion 24h and the second portion 16b of the oxide semiconductor layer 16. In this case, the area size ratio of the light-blocking region in the contact portion is made smaller, and thus the reduction of the light utilization efficiency caused by the light-blocking region in the contact portion is suppressed more efficiently. In an embodiment in which the pixel electrode and the drain electrode 18d are in direct contact with each other (in an embodiment in which the connection portion 24h is omitted), substantially the same effect is provided in the case where the contact area size of the pixel electrode and the top surface of the drain electrode 18d in the contact hole 22a is smaller than the contact area size of the pixel electrode and the second portion 16b of the oxide semiconductor layer 16. The connection portion 24h (or the pixel electrode) is in contact with the side surface of the drain electrode 18d in addition to a part of the top surface of the drain electrode 18d in the contact hole 22a. Therefore, a contact area size sufficient for electrical connection between the connection portion 24h (or the pixel electrode) and the drain electrode 18d is easily obtained.

As shown in FIG. 2(a), in the TFT substrate 100B, the drain electrode 18d is located on the first portion 16a of the oxide semiconductor layer 16, and the drain electrode 18d and the connection portion 24h are electrically connected with each other. In this structure, the TFT 10 has a channel length defined by the distance between the drain electrode 18d and the source electrode 18s. The formation of the drain electrode 18d may be omitted, but in such a case, the channel length of the TFT 10 is defined by the distance between a connection portion between the oxide semiconductor layer 16 and the connection portion 24h and the source electrode 18s. In this case, a plurality of layers need to be formed until the channel length of the TFT 10 is determined, and therefore the variance in the channel length in the manufacturing process is made large. By contrast, in the TFT substrate 100B, the drain electrode 18d and the source electrode 18s are formed of the same metal layer as described later. Therefore, the variance in the channel length in the manufacturing process is decreased. As can be seen, the variance in the channel length is decreased by locating the drain electrode 18d between the channel of the TFT 10 and the connection portion 24h.

As described above, in the embodiment according to the present invention, the diameter of the contact hole is decreased. Therefore, as compared with in a conventional structure, a larger storage capacitance is formed in the pixel. This will be described with reference to FIG. 4(a), FIG. 4(b), FIG. 5(a) and FIG. 5(b).

Figure 4:
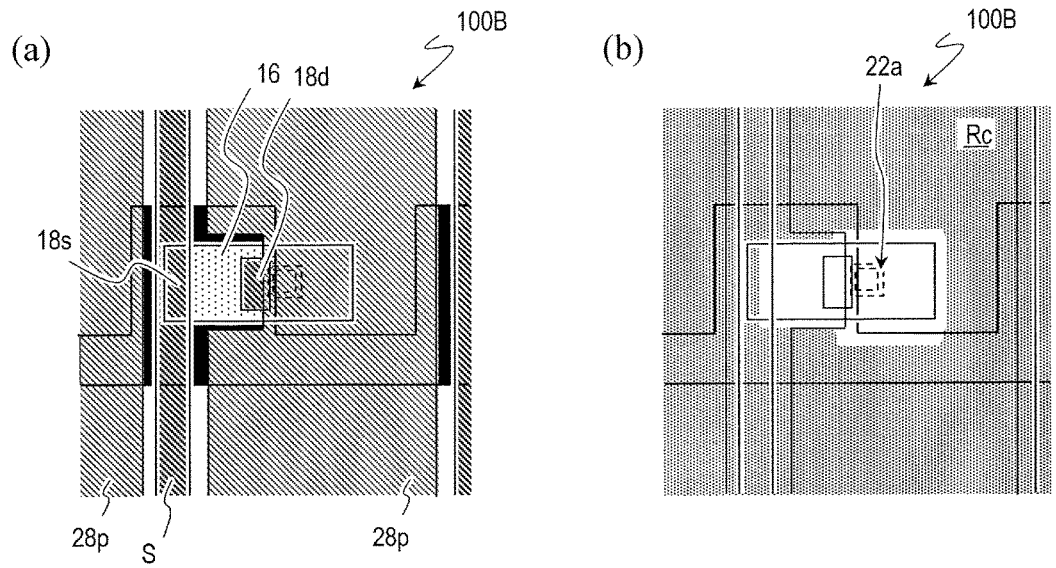
FIG. 4(a) and FIG. 4(b) are each an enlarged plan view of a TFT portion and the vicinity thereof of the TFT substrate 100B.
Figure 5:
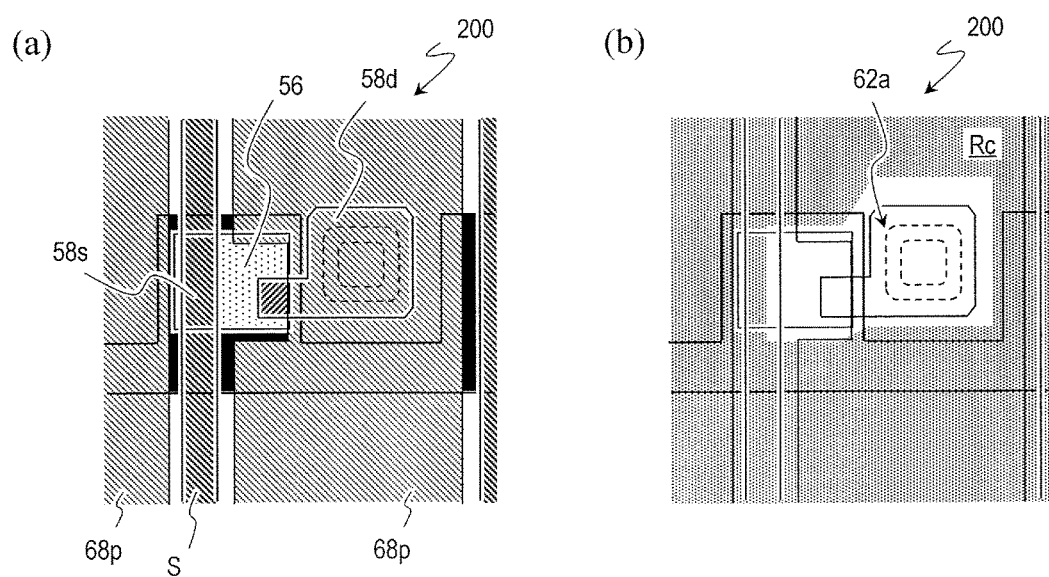
FIG. 5(a) and FIG. 5(b) are each an enlarged plan view of a TFT portion and the vicinity thereof of the TFT substrate 200 in the reference example.

FIG. 4(a) and FIG. 4(b) are each an enlarged plan view of a TFT portion and the vicinity thereof of the TFT substrate 100B. FIG. 5(a) and FIG. 5(b) are each an enlarged plan view of a TFT portion and the vicinity thereof of the TFT 200 in the reference example. FIG. 4(b) shows the same area as FIG. 4(a), and the hatched area in FIG. 4(b) represents a region Rc, which may act as a storage capacitance. Similarly, FIG. 5(b) shows the same area as FIG. 5(a), and the hatched area in FIG. 5(b) represents a region Rc, which may act as a storage capacitance.

As described above, in the TFT substrate 100B, the storage capacitance may be formed in a portion where the pixel electrode 28p and the transparent electrode 24k overlap each other with the dielectric layer 26 being provided therebetween. Therefore, the storage capacitance may be formed in the entire area except for an area where one of the pixel electrode 28p and the transparent electrode 24k is not formed or except for an area where neither the pixel electrode 28p nor the transparent electrode 24k is formed. In the TFT substrate 100B, the transparent electrode 24k is formed in an area except for the vicinity of the connection portion 24h, in order to prevent the transparent electrode 24k and the connection portion 24h from being electrically connected with each other. Namely, the transparent electrode 24k is not formed in the vicinity of the contact hole 22a. In the TFT substrate 200 in the reference example also, the transparent electrode 64k is not formed in the vicinity of the contact hole 62a, in order to prevent the transparent electrode 64k and the pixel electrode 68p from being electrically connected with each other.

The diameter of the contact hole in the TFT portion of the TFT substrate 100B shown in FIG. 4(b) is shorter than the diameter of the contact hole in the TFT portion of the TFT substrate 200 in FIG. 5(b). Therefore, the transparent electrode 24k may be formed in an larger area in the pixel than in the conventional structure. This enlarges the portion where the pixel electrode 28p and the transparent electrode 24k overlap each other as compared with in the conventional structure, and thus a storage capacitance larger than that in the conventional structure may be formed in the pixel. Since a storage capacitance larger than that of the conventional structure is formed in the pixel, the ratio of the gate-drain parasitic capacitance (Cgd) with respect to the total capacitance of the pixel (liquid crystal capacitance Clc+storage capacitance Cs+gate-drain parasitic capacitance Cgd) is decreased. Thus, the influence of the field-through voltage is decreased.

Figure 6:
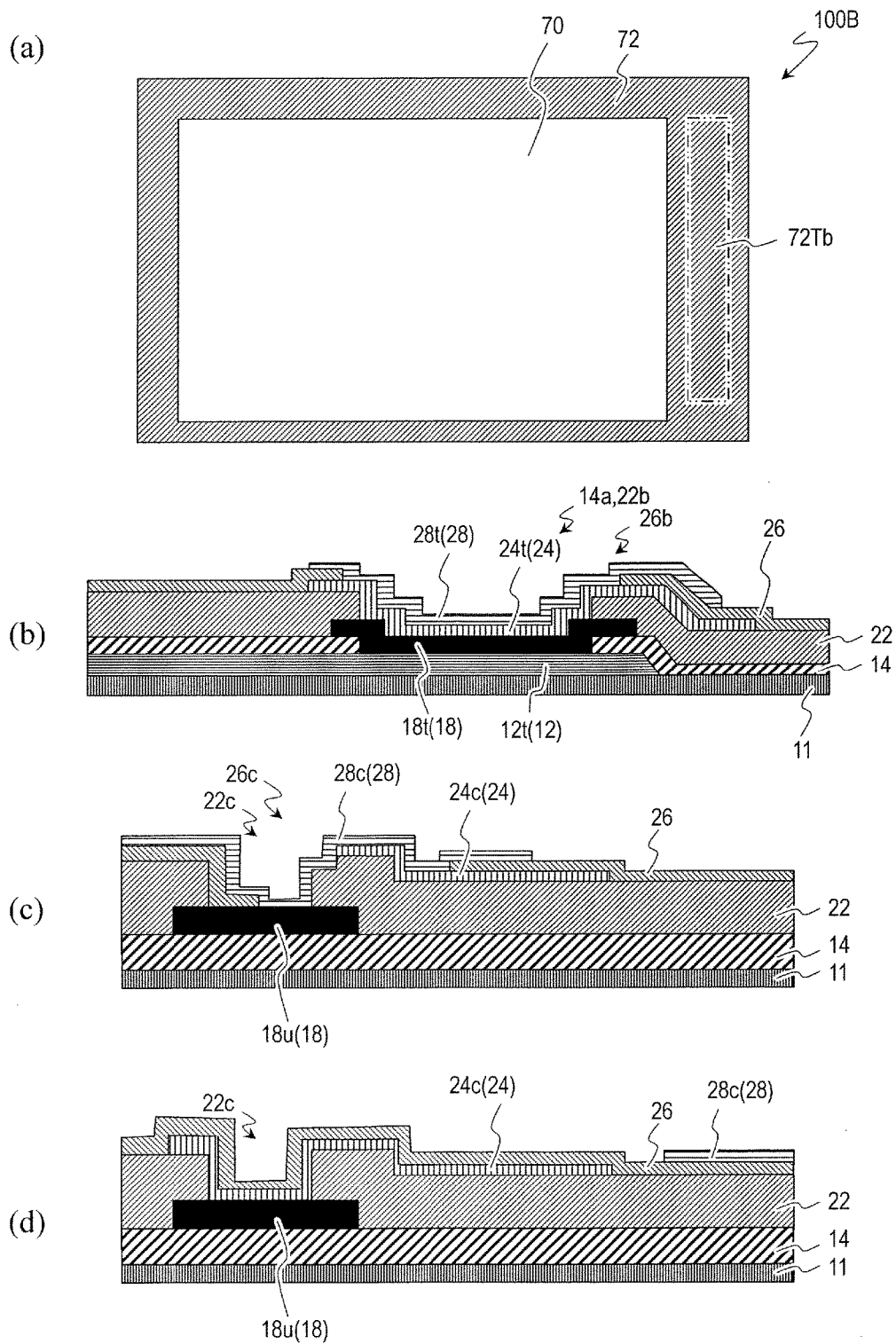
FIG. 6(a) schematically shows an example of planar structure of the TFT substrate 100B.
FIG. 6(b) is a schematic cross-sectional view of a terminal included in a terminal portion 72Tb.
FIG. 6(c) is a schematic cross-sectional view of an S-COM connection portion.
FIG. 6(d) shows another example of S-COM connection portion.
Figure 8:
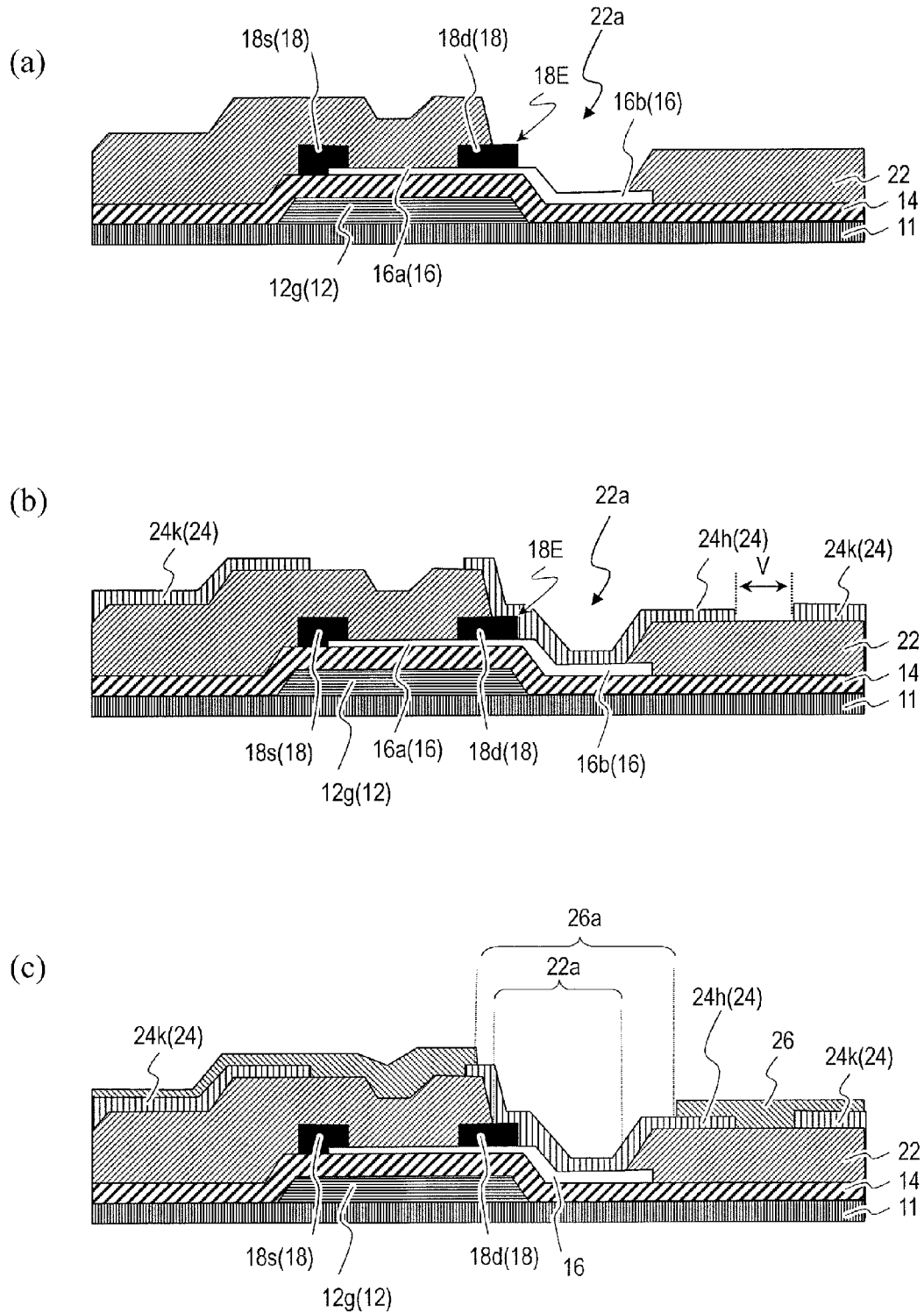
FIG. 8(a) through FIG. 8(c) are each a schematic cross-sectional view showing a step for forming the TFT portion of the TFT substrate 100B.
Figure 9:
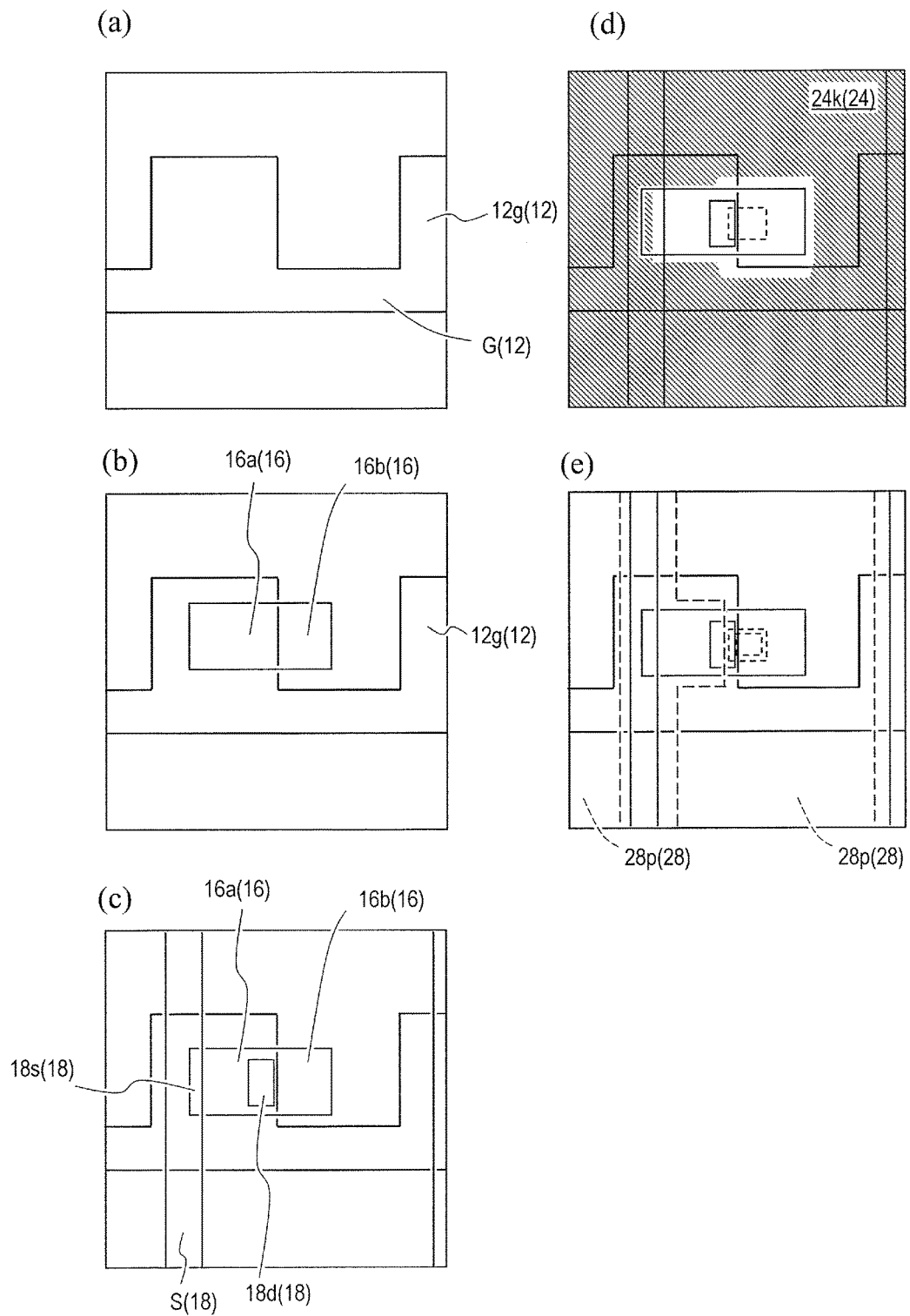
FIG. 9(a) through FIG. 9(e) are each a schematic plan view showing a step for forming the TFT portion of the TFT substrate 100B.
Figure 11:
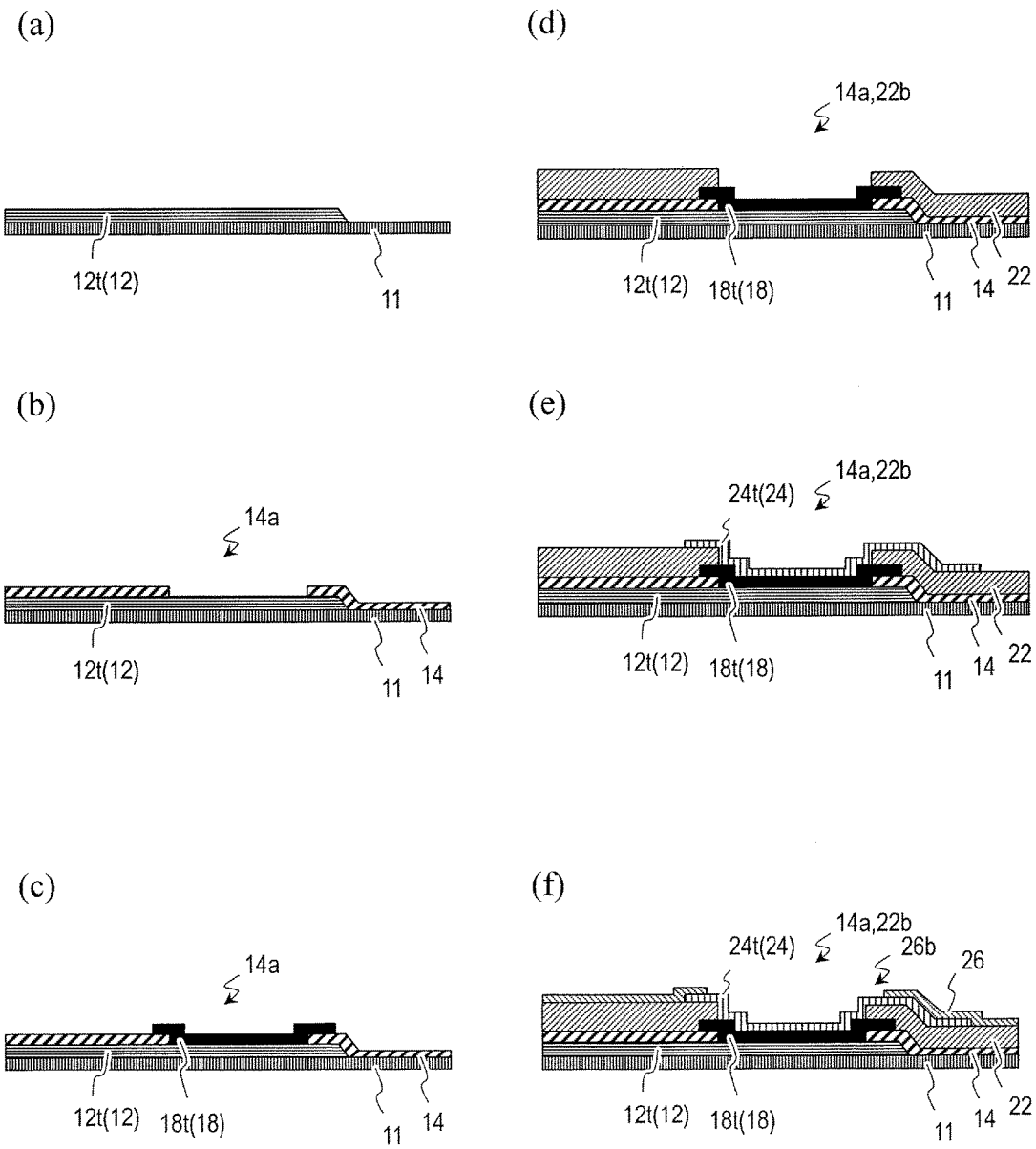
FIG. 11(a) through FIG. 11(f) are each a schematic cross-sectional view showing a step for forming the terminal portion 72Tb of the TFT substrate 100B.
Figure 12:
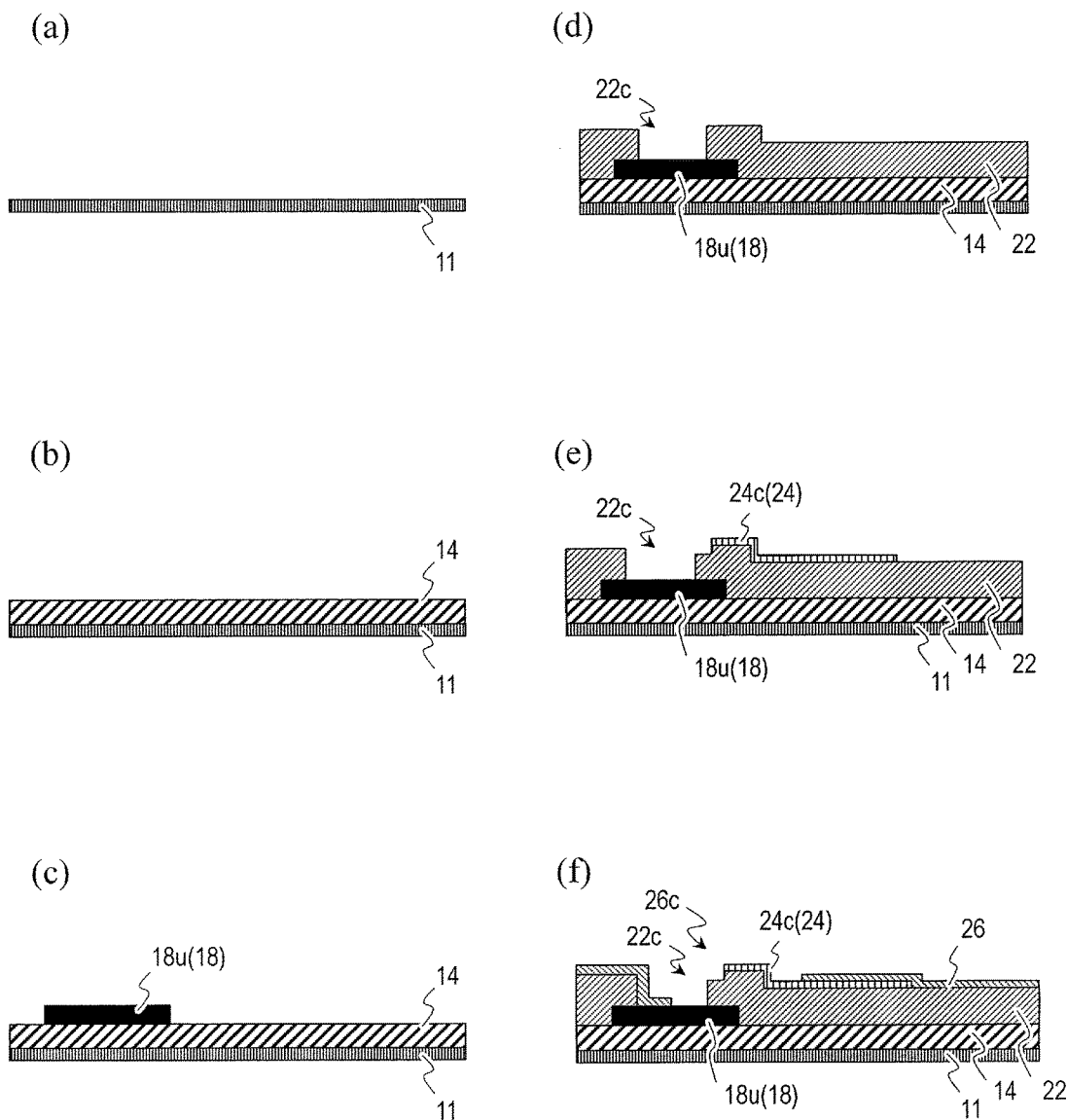
FIG. 12(a) through FIG. 12(f) are each a schematic cross-sectional view showing a step for forming the S-COM connection portion of the TFT substrate 100B.

Now, with reference to FIG. 6, a structure for applying a common signal to the transparent electrode 24k will be described.

FIG. 6(a) schematically shows an example of planar structure of the TFT substrate 100B. The TFT substrate 100B includes a display region (active region) 70 and a peripheral region (frame region) 72 located outer to the display region 70. The display region 70 of the TFT substrate 100B includes a plurality of pixels arrayed in, for example, a matrix. Each of the pixels includes the TFT 10, the pixel electrode 28p and the transparent electrode 24k. The transparent electrode 24k is formed in substantially the entirety of the display region 70 except for, for example, the TFT portion of each pixel Pix. During the operation of the TFT substrate 100B, the transparent electrodes 24k in the pixels have an equal potential.

In the peripheral region 72, a terminal portion 72Tb including a plurality of terminals is formed. Also in the peripheral region 72, an upper line layer formed of the same metal film as that of the source line S and a lower line layer formed of the same metal film as that of the gate line G are formed. Various types of signals (e.g., display signal, scanning signal, common signal, etc.) that are input to a terminal in the terminal portion 72Tb from external lines are supplied to the TFT substrate 100B via the upper line layer and/or the lower line layer. For example, a display signal and a scanning signal that are input to a terminal in the terminal portion 72Tb are supplied to the corresponding source line S or gate line G via the upper line layer and/or the lower line layer, and a common signal that is input to a terminal in the terminal portion 72Tb is supplied to the corresponding transparent electrode 24k via the upper line layer and/or the lower line layer. For example, an S-COM connection portion that connects the upper line layer and the transparent electrode 24 with each other is formed in the peripheral region 72. In the peripheral region 72, an S-G connection portion (connection switching portion) that connects the upper line layer and the lower line layer with each other may be formed.

FIG. 6(b) is a schematic cross-sectional view of a terminal included in the terminal portion 72Tb. In the structure shown in FIG. 6(b) as an example, a lower line layer 12t formed of the same metal film as that of the first metal layer 12 and an upper line layer 18t formed of the same metal film as that of the second metal layer 18 are in contact with each other in a contact hole 14a provided in the gate insulating layer 14. The interlayer insulating layer 22 is formed on the upper line layer 18t and includes a contact hole 22b at a position corresponding to the contact hole 14a of the gate insulating layer 14. A lower transparent connection layer 24t is formed in the contact hole 22b and is in contact with the upper line layer 18t in the contact hole 22b. The dielectric layer 26 is formed on the lower transparent connection layer 24t and includes an opening 26b at a position corresponding to the contact hole 22b of the interlayer insulating layer 22. In the opening 26b, the lower transparent connection layer 24t and an upper transparent connection layer 28t formed on the lower transparent connection layer 24t are in contact with each other. The lower transparent connection layer 24t is formed in the same layer as the transparent electrode 24k and the connection portion 24h (formed in the lower transparent electrode layer 24). The upper transparent connection layer 28t is formed in the same layer as the pixel electrode 28p (formed in the upper transparent electrode layer 28). The lower transparent connection layer 24t may be omitted.

FIG. 6(c) is a schematic cross-sectional view of the S-COM connection portion, and FIG. 6(d) shows another example of S-COM connection portion. In the structure shown in FIG. 6(c) as an example, the interlayer insulating layer 22 includes a contact hole 22c formed so as to overlap an upper line layer 18u when viewed along a normal to the substrate 11. The upper line layer 18u is formed of the same metal film as that of the second metal layer 18. In the contact hole 22c, an upper transparent connection layer 28c formed in the same transparent conductive layer as the pixel electrode 28p (formed in the upper transparent electrode layer 28) is in contact with the upper line layer 18u. In an opening 26c, of the dielectric layer 26, formed at a position corresponding to the contact hole 22c, the upper transparent connection layer 28c is in contact with a lower transparent connection layer 24c, which is formed in the same layer as the transparent electrode 24k (formed in the lower transparent electrode layer 24) and is electrically connected with the transparent electrode 24k. Namely, in the example shown in FIG. 6(c), the upper line layer 18u and the transparent electrode 24k are electrically connected with each other via the upper transparent connection layer 28c. Because of this structure, a common signal input to a terminal in the terminal portion 72Tb is supplied to the transparent electrode 24k via, for example, a lower line layer, the upper line layer 18u and the upper transparent connection layer 28c.

In the structure shown in FIG. 6(c) as an example, the opening 26c of the dielectric layer 26 is formed so as to overlap a part of the contact hole 22c when viewed along a normal to the substrate 11, and a part of the dielectric layer 26 is present in the contact hole 22c. In the case where the opening 26c overlaps at least a part of the contact hole 22c in this manner, the upper transparent connection layer 28c and the upper line layer 18u are electrically connected with each other in the contact hole 22c. In addition, this provides an advantage that the S-COM connection portion may be formed in a smaller area as compared with in the structure in which the entirety of the contact hole 22c is in the opening 26c of the dielectric layer 26. A reason for this is that in order to form the opening 26c such that the entirety of the contact hole 22 is in the opening 26c, the opening 26c needs to be formed to be large in consideration of the process margin.

As shown in FIG. 6(d), the lower transparent connection layer 24c and the upper line layer 18u may be in contact with each other in the contact hole 22c formed so as to overlap the upper line layer 18u. In the example shown in the figure, the lower transparent connection layer 24c is covered with the dielectric layer 26. In the case where the transparent electrode 24k acts as a storage capacitance electrode, a signal different from the common signal may be applied to the transparent electrode 24k.

Now, with reference to FIG. 7 through FIG. 12, a method for manufacturing a semiconductor device in an embodiment according to the present invention will be described. FIG. 7(a) through FIG. 7(d) and FIG. 8(a) through FIG. 8(c) are each a schematic cross-sectional view showing a step for forming the TFT portion of the TFT substrate 100B. In this example, the method for manufacturing the TFT substrate 100B will be described. A method for manufacturing the TFT substrate 100A shown in FIG. 1(a) and FIG. 1(b) is substantially the same as the method for manufacturing the TFT substrate 100B except for not including a step of forming the dielectric layer 26 and a step of forming the upper transparent electrode layer 28, and thus will not be described.

First, as shown in FIG. 7(a), a first metal film is deposited on the substrate (e.g., glass substrate) 11 and patterned to form the first metal layer 12. The first metal film may be formed of a metal material such as aluminum (Al), chromium (Cr), copper (Cu), tantalum (Ta), titanium (Ti), molybdenum (Mo), tungsten (W) or the like, an alloy containing at least one of these metal materials, or a metal nitride thereof. The first metal film may be a single layer film formed of any of the above-described materials, or may have a stack of films formed of any of the above-described materials. For example, a Ti/Al/Ti (upper layer/middle layer/lower layer) stack or a Mo/Al/Mo stack may be used. The stack structure of the first metal film is not limited to a three-layer structure, and may be a two-layer structure or a structure including four or more layers. In this example, the first metal film having a stack structure of a TaN film (film thickness: 5 to 100 nm) and a W film (film thickness: 5 to 500 nm) is formed by, for example, sputtering, and then patterned by a photolithography process to form the first metal layer 12 including the gate electrode 12g. FIG. 9(a) is a plan view after the first metal layer 12 is formed.

Next, as shown in FIG. 7(b), a gate insulating film is deposited on the first metal layer 12 to form the gate insulating layer 14 covering the first metal layer 12. The gate insulating film may be, for example, a silicon oxide ($SiO_x$) film, a silicon nitride ($SiN_x$) film, a silicon oxide nitride ($SiO_xN_y$, x>y) film, a silicon nitride oxide ($SiN_xO_y$, x>y) film, an aluminum oxide film or a tantalum oxide film, or may have a stack of films containing at least one thereof. In this example, an $SiN_x$ film (film thickness: 100 to 500 nm) and an $SiO_2$ film (film thickness: 20 to 100 nm) are deposited sequentially by, for example, CVD (Chemical Vapor Deposition) to form the gate insulating layer 14.

Next, as shown in FIG. 7(c), an oxide semiconductor film is deposited on the gate insulating layer 14 by, for example, sputtering and patterned to form the oxide semiconductor layer 16 of an island pattern. In this example, an oxide semiconductor film (film thickness: 20 to 200 nm) containing a semiconductor of an In—Ga—Zn—O-type is deposited and patterned by a photolithography process to form the oxide semiconductor layer 16 of an island pattern on the gate insulating layer 14. In this step, the oxide semiconductor film is patterned such that the oxide semiconductor layer 16 of an island pattern includes a portion overlapping the gate electrode 12g (first portion 16a) and a portion not overlapping the gate electrode 12g (second portion 16b). Namely, the oxide semiconductor layer 16 of an island pattern includes the first portion 16a and the second portion 16b extending from the first portion 16a while crossing an edge at one end of the gate electrode 12g. FIG. 9(b) is a plan view after the oxide semiconductor layer 16 is formed.

The oxide semiconductor layer 16 contains, for example, a semiconductor of an In—Ga—Zn—O-type (hereinafter, simply referred to as an "In—Ga—Zn—O-type semiconductor"). The In—Ga—Zn—O-type semiconductor is a three-component oxide of In (indium), Ga (gallium) and zinc (Zn). There is no specific limitation on the ratio (composition ratio) of In, Ga and Zn. The ratio of In:Ga:Zn may be, for example, In:Ga:Zn=2:2:1, In:Ga:Zn=1:1:1, In:Ga:Zn=1:1:2, or the like. In this embodiment, the oxide semiconductor layer 16 may be an In—Ga—Zn—O-type semiconductor layer containing In, Ga and Zn at a ratio of, for example, In:Ga:Zn=1:1:1.

A TFT including the In—Ga—Zn—O-type semiconductor layer has a high mobility (more than 20 times the mobility of an a-Si TFT) and a low leak current (less than 1/100 of that of the a-Si TFT), and therefore is preferably usable as a driving TFT and a pixel TFT. Use of a TFT including the In—Ga—Zn—O-type semiconductor layer allows the power consumption of the display device to be significantly decreased.

The In—Ga—Zn—O-type semiconductor may be amorphous or may include a crystalline portion. A preferable crystalline In—Ga—Zn—O-type semiconductor has a c axis aligned generally perpendicularly to the surface of the layer. A crystalline structure of such an In—Ga—Zn—O-type semiconductor is disclosed in, for example, Japanese Laid-Open Patent Publication No. 2012-134475. The entire disclosure of Japanese Laid-Open Patent Publication No. 2012-134475 is incorporated herein by reference.

The oxide semiconductor layer 16 may contain another oxide semiconductor instead of the In—Ga—Zn—O-type semiconductor. For example, the oxide semiconductor layer 16 may contain, a Zn—O-type semiconductor (ZnO), an In—Zn—O-type semiconductor (IZO (registered trademark)), a Zn—Ti—O-type semiconductor (ZTO), a Cd—Ge—O-type semiconductor, a Cd—Pb—O-type semiconductor, CdO (cadmium oxide), a Mg—Zn—O-type semiconductor, an In—Sn—Zn—O-type semiconductor (e.g., $In_2O_3$—$SnO_2$—ZnO), an In—Ga—Sn—O-type semiconductor, or the like.

Next, as shown in FIG. 7(d), a second metal film is deposited on the oxide semiconductor layer 16 and patterned to form the second metal layer 18. The second metal film may be formed of any of substantially the same materials as for the first metal film. Needless to say, the second metal film may have a stack of films. In this example, a Ti film (film thickness: 10 to 100 nm), an Al film (film thickness: 50 to 400 nm) and a Ti film (film thickness: 50 to 300 nm) are deposited sequentially by, for example, sputtering to form the second metal film of a three-layer structure. Then, the second metal film is patterned by a photolithography process to form the second metal layer 18 including the source electrode 18s and the drain electrode 18d. Prior to patterning the second metal film, an etching protection layer may be formed on the oxide semiconductor layer 16. As shown in FIG. 7(d), the drain electrode 18d is located closer to the second portion 16b of the oxide semiconductor layer 16 than the source electrode 18s is. FIG. 9(c) is a plan view after the second metal layer 18 is formed. As shown in FIG. 9(c), the second metal film is patterned such that the entirety of the drain electrode 18d is located on the oxide semiconductor layer 16.

Next, a first insulating film is deposited on the second metal layer 18 to form an interlayer information film. The first insulating film may be formed of any of substantially the same materials as for the gate insulating film. The first insulating film may have a stack of films. It should be noted that the first insulating film does not include an organic insulating film formed of an organic insulating material. In this example, an $SiO_2$ film (film thickness: 50 to 1000 nm) is deposited by, for example, CVD, and then is annealed (in an atmosphere, 200 to 400° C., 0.5 to 4 hours), and then an $SiN_x$ film (film thickness: 50 to 1000 nm) is deposited to form the interlayer insulating film.

Next, the contact hole 22a is formed by dry etching or wet etching in the interlayer insulating film formed on the second metal layer 18. In this step, as shown in FIG. 8(a), the interlayer insulating film is patterned so as to expose the surface of the second portion 16b of the oxide semiconductor layer 16 and the end 18E, of the drain electrode 18d, closer to the second portion 16b. As a result, the interlayer insulating layer 22 including the contact hole 22a is formed.

The contact hole 22a is formed at a position overlapping the second portion 16b of the oxide semiconductor layer 16. Therefore, in the step of etching the interlayer insulating film, the oxide semiconductor layer 16 may act as an etching stopper. For example, in the case where the oxide semiconductor layer 16 does not include the second portion 16b, the etching performed on the interlayer insulating film may undesirably etch the gate insulating layer 14 below the interlayer insulating film. According to the manufacturing method of the present invention, the oxide semiconductor layer 16 is extended so as to cover the gate insulating layer 14 in the area where the contact hole 22a is to be formed. Therefore, the gate insulating layer 14 is prevented from being etched. Even though the oxide semiconductor layer 16 is extended, the opening region of the contact hole 22a is not shielded against light because the second portion 16b of the oxide semiconductor layer 16 is transparent.

With reference to FIG. 10(a) through FIG. 10(d), an effect provided by extending a part of the oxide semiconductor layer 16 to cross the edge at one end of the gate electrode 12g will be described in more detail. FIG. 10(a) through FIG. 10(c) are each a plan view schematically showing an example of arrangement of the gate electrode 12g, the oxide semiconductor layer 16 and the drain electrode 18d. According to the manufacturing method of the present invention, as shown in FIG. 10(a), the island-patterned oxide semiconductor layer 16 including a part (second portion 16b) extending while crossing the edge at one end of the gate electrode 12g is formed.

Now, a case will be assumed where as shown in FIG. 10(b), it is designed such that an edge of an oxide semiconductor layer 56B matches the edge of the gate electrode 12g. In this case, as shown in FIG. 10(c), the edge of the oxide semiconductor layer 56B may undesirably be offset to a position inner to the edge of the gate electrode 12g (leftward in FIG. 10(c)) due to, for example, an alignment error of a mask at the time of etching performed on the oxide semiconductor film. If the edge of the oxide semiconductor layer 56B is offset to a position inner to the edge of the gate electrode 12g, the gate insulating layer 14 is also etched in the step of etching the interlayer insulating film. As a result, as shown in FIG. 10(d), the gate electrode 12g may undesirably be exposed in the contact hole 22a. In this case, in the step of forming a transparent conductive film described later, the drain electrode 18d and the gate electrode 12g are shortcircuited by the transparent conductive film formed in the contact hole.

If the gate insulating layer 14 is etched in the step of etching the interlayer insulating film, the contact hole is made deeper by the part of the gate insulating layer 14 that is removed (see FIG. 10(d)). In this case, the disturbance of the liquid crystal molecules in the vicinity of the contact hole is increased, which may cause light leak in the vicinity of the contact hole 22a.

In the structure in which a part of the oxide semiconductor layer 16 is extended so as to cross the edge at one end of the gate electrode 12g to form the second portion 16b, the oxide semiconductor layer 16 acts as an etching stopper in the step of etching the interlayer information film as described above. Therefore, inconveniences that the drain electrode 18d and the gate electrode 12g are shortcircuited and that light leaks in the vicinity of the contact hole 22a are suppressed from being caused.

Now, FIG. 8(b) will be referred to. As shown in FIG. 8(b), a first transparent electrode film is deposited on the interlayer information layer 22 and in the contact hole 22a and patterned to form the lower transparent electrode layer 24. The first transparent electrode film may be formed of a metal oxide such as ITO, IZO, ZnO or the like. In this example, a metal oxide film (film thickness: 20 to 300 nm) is formed by, for example, sputtering. Then, the first transparent electrode film is patterned by a photolithography process to form the lower transparent electrode layer 24 including the connection portion 24h and the transparent electrode 24k. In this step, the first transparent electrode film is patterned such that a portion (contact portion) of the transparent electrode film that is in contact with the end 18E of the drain electrode 18d and also in contact with the surface of the second portion 16b of the oxide semiconductor layer 16 is left in the contact hole 22a. The first transparent electrode film is patterned also such that the connection portion 24h and the transparent electrode 24k are not electrically connected with each other. For example, as shown in FIG. 8(b), a gap V is formed between the connection portion 24h and the transparent electrode 24k. The gap V is buried with the dielectric layer 26 described later.

The first transparent electrode film and the oxide semiconductor layer 16 are formed of a metal oxide. Therefore, the etchant used for etching the first transparent electrode film may undesirably remove the second portion 16b of the oxide semiconductor layer 16. If the second portion 16b of the oxide semiconductor layer 16 is removed, the oxide semiconductor layer 16 cannot act as an etching stopper in the step of forming the dielectric layer 26 described later. Therefore, the connection portion 24h is formed so as to cover the entirety of the second portion 16b of the oxide semiconductor layer 16 in the contact hole 22a, and thus a stack structure of the oxide semiconductor layer 16 and the connection portion 24h is formed in the contact hole 22a. In this manner, the oxide semiconductor layer 16 is prevented with more certainty from being removed in the step of etching the first transparent electrode film. FIG. 9(d) is a plan view after the lower transparent electrode layer 24 is formed. In FIG. 9(d), the connection portion 24h is omitted.

Next, a second insulating film is formed on the lower transparent electrode layer 24 to form a dielectric film. The dielectric film may be formed of any of substantially the same inorganic insulating materials as for the gate insulating film or the first insulating film. The dielectric film may have a stack of films. In this example, an SiN$_x$ film (film thickness: 50 to 500 nm) is formed by, for example, CVD. Then, the opening 26a is formed in the dielectric film by dry etching or wet etching. In this step, as shown in FIG. 8(c), the dielectric film is patterned so as to expose a surface of the connection portion 24h in the contact hole 22a. As a result, the dielectric layer 26 including the opening 26a is formed on the lower transparent electrode layer 24.

Next, a second transparent electrode film is deposited on the dielectric layer 26 and in the opening 26a and patterned to form the upper transparent electrode layer 28. The second transparent electrode film may be formed of any of substantially the same materials as for the first transparent electrode film. In this example, a metal oxide film (film thickness: 20 to 300 nm) is formed by, for example, sputtering. Then, the second transparent electrode film is patterned by a photolithography process to form the upper transparent electrode layer 28 including the pixel electrode 28p. In this step, the second transparent electrode film is patterned such that a part thereof that is in contact with the connection portion 24h is left in the opening 26a. As a result, the TFT substrate 100B shown in FIG. 2(a) and FIG. 2(b) is obtained. FIG. 9(e) is a plan view after the upper transparent electrode layer 28 is formed.

Hereinafter, a method for forming the terminal portion 72Tb and the S-COM connection portion of the TFT substrate 100B will be described. FIG. 11(a) through FIG. 11(f) are each a schematic cross-sectional view showing a step for forming the terminal portion 72Tb of the TFT substrate 100B. FIG. 12(a) through FIG. 12(f) are each a schematic cross-sectional view showing a step for forming the S-COM connection portion of the TFT substrate 100B. The steps shown in FIG. 11(a) through FIG. 11(f) respectively correspond to the steps shown in FIG. 12(a) through FIG. 12(f). FIG. 11(a) through FIG. 11(f) respectively correspond to FIG. 7(a), FIG. 7(b), FIG. 7(d), FIG. 8(a), FIG. 8(b) and FIG. 8(c) referred to above. FIG. 12(a) through FIG. 12(f) respectively correspond to FIG. 7(a), FIG. 7(b), FIG. 7(d), FIG. 8(a), FIG. 8(b) and FIG. 8(c) referred to above.

In the step of forming the first metal layer 12, the lower line layer 12t is formed in the terminal portion 72Tb (FIG. 11(a)). Next, in the step of forming the gate insulating layer 14, the gate insulating layer 14 including the contact hole 14a is formed on the lower line layer 12t in the terminal portion 72Tb. The contact hole 14a is formed so as to expose a part of the lower line layer 12t (FIG. 11(b)). In the meantime, in the S-COM connection portion, the gate insulating layer 14 is formed so as to cover the substrate 11 (FIG. 12(b)).

Next, in the step of forming the second metal layer 18, the upper line layers 18t and 18u are respectively formed in the terminal portion 72Tb and the S-COM connection portion (FIG. 11(c) and FIG. 12(c)). The upper line layer 18t in the terminal portion 72Tb is in contact with, and is electrically connected with, the lower line layer 12t in the contact hole 14a. Next, in the step of forming the interlayer insulating layer 22, the interlayer insulating layer 22 including the contact hole 22b is formed in the terminal portion 72Tb (FIG. 11(d)). The contact hole 22b is formed so as to overlap the upper line layer 18t, and a surface of the upper line layer 18t is exposed in the contact hole 22b. Similarly in the S-COM connection portion, the interlayer insulating layer 22 including the contact hole 22c is formed (FIG. 12(d)). The contact hole 22c is formed so as to overlap the upper line layer 18u, and a surface of the upper line layer 18u is exposed in the contact hole 22c.

Next, in the step of forming the lower transparent electrode layer 24, the lower transparent connection layer 24t in contact with the surface of the upper line layer 18t in the contact hole 22b is formed in the terminal portion 72Tb (FIG. 11(e)). The lower transparent connection layer 24t is electrically connected with the upper line layer 18t. In the meantime, in the S-COM connection portion, the lower transparent connection layer 24c is formed on the interlayer insulating layer 22 (FIG. 12(e)). Alternatively, the lower transparent connection layer 24c may be formed on the interlayer insulating layer 22 and in the contact hole 22c, so that the surface of the upper line layer 18u and the lower transparent connection layer 24c are in contact with each other in the contact hole 22c. In this case, in the step of forming the dielectric layer 26 described later, the dielectric layer 26 may be formed so as to cover the lower transparent connection layer 24c to realize the structure shown in FIG. 6(d).

Next, in the step of forming the dielectric layer 26, the dielectric layer 26 including the opening 26b at a position corresponding to the contact hole 22b is formed in the terminal portion 72Tb (FIG. 11(f)). Similarly in the S-COM connection portion, the dielectric layer 26 including the opening 26c at a position corresponding to the contact hole 22c is formed (FIG. 12(f)). As shown in FIG. 12(f), at least a part of the lower transparent connection layer 24c is exposed in the opening 26c. At least a part of the upper line layer 18u is exposed in the opening 26c. In this step, as described above with reference to FIG. 6(c), the opening 26c of the dielectric layer 26 may be formed so as to overlap a part of the contact hole 22c when viewed along a normal to the substrate 11. In this case, an advantage is provided that the S-COM connection portion is formed in a smaller area than in the structure in which the entirety of the contact hole 22c is in the opening 26c of the dielectric layer 26.

Next, in the step of forming the upper transparent electrode layer 28, in the terminal portion 72Tb, the upper transparent connection layer 28t in contact with a surface of, and electrically connected with, the lower transparent connection layer 24t in the opening 26b is formed. As a result, the structure shown in FIG. 6(b) is realized. In the S-COM connection portion, the upper transparent connection layer 28c in contact with the surface of the upper line layer 18u in the contact hole 22c and in contact with the lower transparent connection layer 24c in the opening 26c is formed. Namely, the upper line layer 18u and the lower transparent connection layer 24c are electrically connected with each other via the upper transparent connection layer 28c. As a result, the structure shown in FIG. 6(c) is realized.

According to the manufacturing method of the present invention, a semiconductor device that suppresses the reduction of the light utilization efficiency as compared with a conventional semiconductor device is manufactured without significantly changing the existing process.

Now, with reference to FIG. 13, a structure of a TFT substrate 100C in embodiment 3 according to the present invention will be described.

Figure 13:
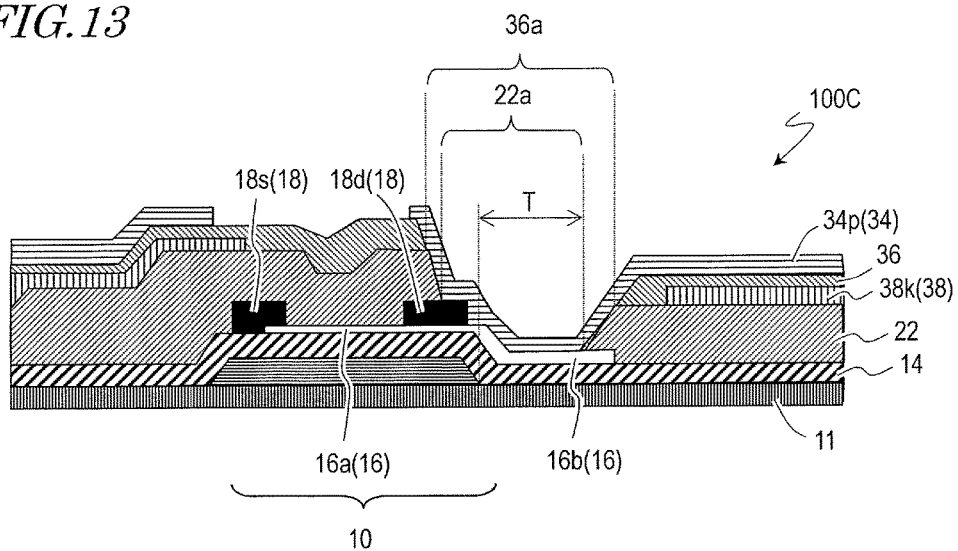
FIG. 13 is a schematic cross-sectional view of a TFT substrate 100C in embodiment 3 according to the present invention.

FIG. 13 is a schematic cross-sectional view of the TFT substrate 100C in embodiment 3 according to the present invention. The TFT substrate 100C shown in FIG. 3 may be the same as the TFT substrate 100A shown in FIG. 1 except for further including a dielectric layer 36 located between the interlayer insulating layer and an upper transparent electrode layer 34 and a lower transparent electrode layer 38 located between the interlayer insulating layer 22 and the dielectric layer 36. A pixel electrode 34p shown in FIG. 13 corresponds to the transparent conductive layer Tc of the TFT substrate 100A. In the TFT substrate 100C, the transparent conductive layer Tc acts as a pixel electrode.

The upper transparent electrode layer 34 includes the pixel electrode 34p. As shown in FIG. 13, the pixel electrode 34p is in contact with the top surface of the drain electrode 18d in the vicinity of the end 18E and the side surface of the drain electrode 18d in the contact hole 22a. Because of this structure, the pixel electrode 34p is electrically connected with the drain electrode 18d. An alignment film (not shown) may be formed on the upper transparent electrode layer 34 (on the side opposite to the substrate 11).

As shown in FIG. 13, the lower transparent electrode layer 38 of the TFT substrate 100C includes a transparent electrode 38k. The dielectric layer 36 substantially covers an entire surface of the transparent electrode 38k. Namely, the transparent electrode 38k is not electrically connected with the pixel electrode 34p. Also as shown in FIG. 13, the transparent electrode 38k faces the pixel electrode 34p with the dielectric layer 36 being provided between the transparent electrode 38k and the pixel electrode 34p. As can be seen, a two-layer electrode structure may be formed by providing the transparent electrode 38k on the substrate 11 side with respect to the pixel electrode 34p, which is connected with the drain electrode 18d with no connection portion being provided therebetween.

For example, the transparent electrode 38k may act as a common electrode in the FFS mode. In this case, the pixel electrode 34p has a plurality of slits formed therein. Alternatively, for example, the transparent electrode 38k may act as a storage capacitance electrode in the VA mode or the like. In this case, a storage capacitance larger than that of the TFT substrate 100B described above may be formed.

Figure 14:
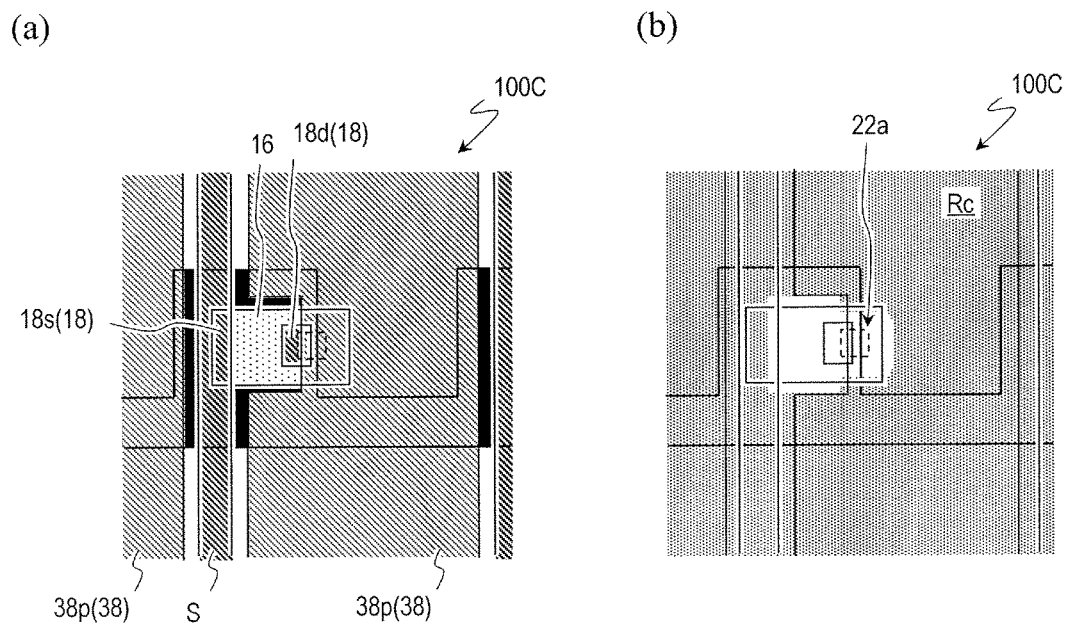
FIG. 14(a) and FIG. 14(b) are each an enlarged plan view of a TFT portion and the vicinity thereof of the TFT substrate 100C.

FIG. 14(a) and FIG. 14(b) are each an enlarged plan view of a TFT portion and the vicinity thereof of the TFT substrate 100C. FIG. 14(b) shows the same area as FIG. 14(a), and the hatched area in FIG. 14(b) represents a region Rc, which may act as a storage capacitance.

As described above, in the TFT substrate 100B, a single transparent conductive film is patterned to form the connection portion 24h and the transparent electrode 24k. Therefore, in order to electrically separate the connection portion 24h and the transparent electrode 24k from each other in such a structure, the gap V is formed between an edge of the connection portion 24h and an edge of the transparent electrode 24k (see FIG. 8(b)). By contrast, in the TFT substrate 100C shown in FIG. 13, there is no connection portion between the pixel electrode 34p and the drain electrode 18d (and the second portion 16b of the oxide semiconductor layer 16). Therefore, there is no need to form the gap V shown in FIG. 8(b). This allows an edge of the transparent electrode 38k to be closer to the contact hole 22a. Namely, the transparent electrode 38k may be formed in a larger area. As can be seen by comparing FIG. 14(b) and FIG. 4(b), an area which may act as a storage capacitance is larger than in the TFT substrate 100B.

Figure 15:
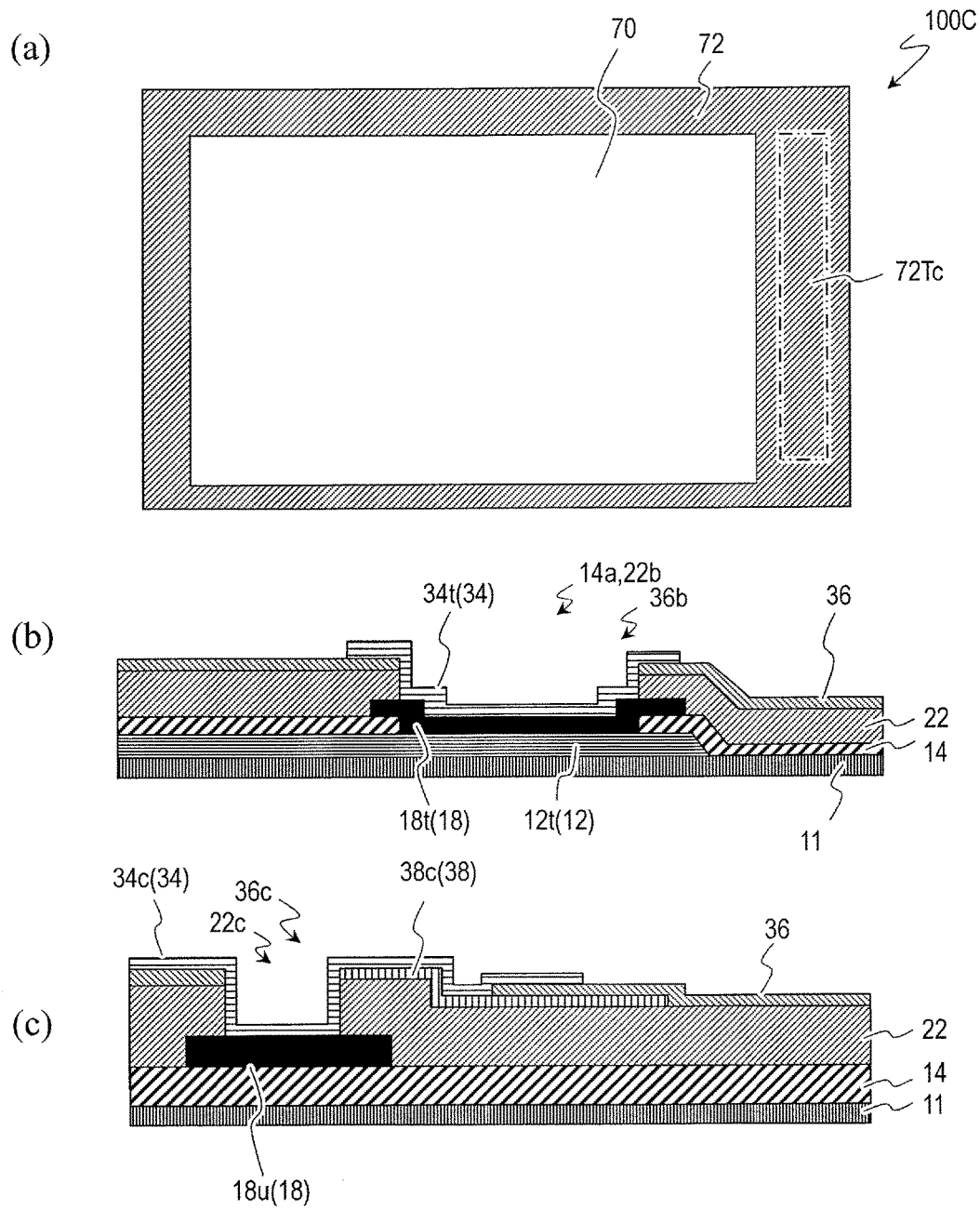
FIG. 15(a) schematically shows an example of planar structure of the TFT substrate 100C.
FIG. 15(b) is a schematic cross-sectional view of a terminal included in a terminal portion 72Tc.
FIG. 15(c) is a schematic cross-sectional view of an S-COM connection portion.

FIG. 15(a) schematically shows an example of planar structure of the TFT substrate 100C, and FIG. 15(b) is a schematic cross-sectional view of a terminal included in a terminal portion 72Tc shown in FIG. 15(a).

In the structure shown in FIG. 15(b) as an example, in the contact hole 22b of the interlayer insulating layer 22 and an opening 36b of the dielectric layer 36, which are located at a potion corresponding to the contact hole 14a of the gate insulating layer 14, the upper line layer 18t formed of the same metal film as that of the second metal layer 18 and an upper transparent connection layer 34t formed of the same transparent conductive film as that of the upper transparent electrode layer 34 are in contact with each other.

FIG. 15(c) is a schematic cross-sectional view of an S-COM connection portion. In the structure shown in FIG. 15(c) as an example, the interlayer insulating layer 22 includes the contact hole 22c formed so as to overlap the upper line layer 18u when viewed along a normal to the substrate 11. In the contact hole 22c, an upper transparent connection layer 34c formed in the same transparent conductive layer as the pixel electrode 34p (formed in the upper transparent electrode layer 34) is in contact with the upper line layer 18u. In an opening 36c, of the dielectric layer 36, located at a position corresponding to the contact hole 22c, the upper transparent connection layer 34c is in contact with a lower transparent connection layer 38c, which is formed in the same layer as the transparent electrode 38k (formed in the lower transparent electrode layer 38) and is electrically connected with the transparent electrode 38k. In the example shown in FIG. 15(c), a common signal input to a terminal in the terminal portion 72Tb may be supplied to the transparent electrode 38k via, for example, the lower line layer, the upper line layer 18u and the upper transparent connection layer 34c.

Figure 17:
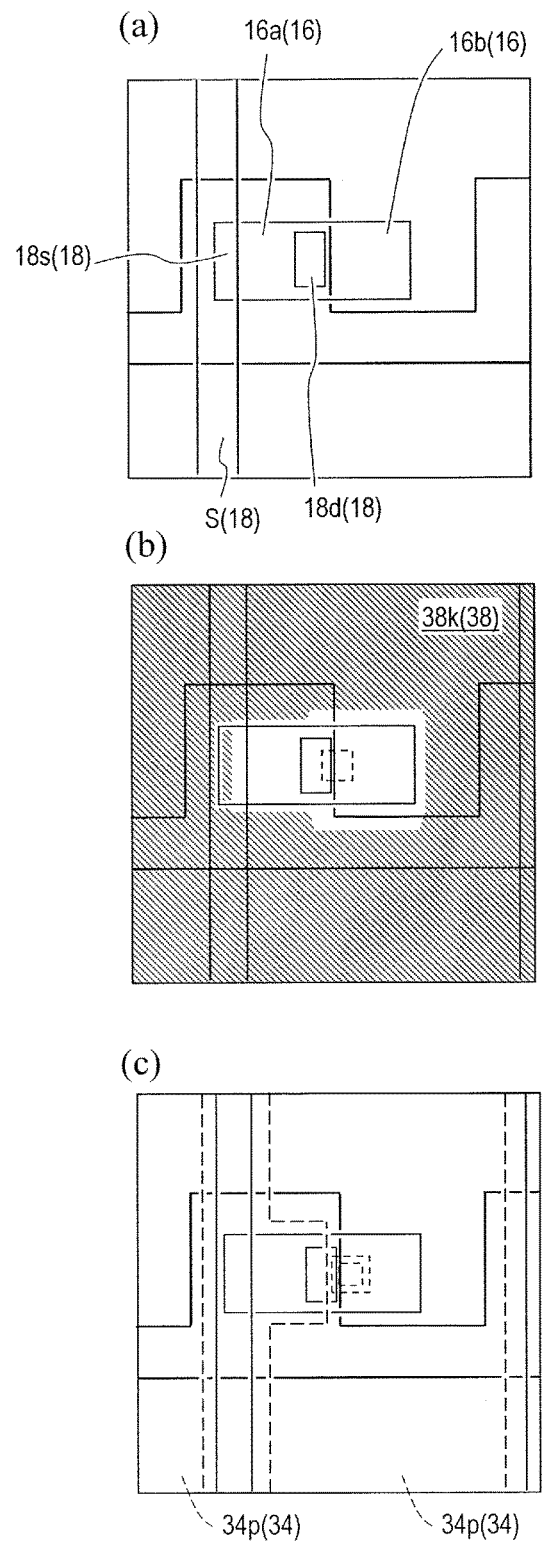
FIG. 17(a) through FIG. 17(c) are each a schematic plan view showing a step for forming the TFT portion of the TFT substrate 100C.

Now, with reference to FIG. 16 and FIG. 17, a method for manufacturing the above-described TFT substrate 100C will be described. FIG. 16(a) through FIG. 16(c) are each a schematic cross-sectional view showing a step for forming the TFT portion of the TFT substrate 100C. Up to the formation of the second metal layer 18, the manufacturing method may be substantially the same as that of the TFT substrate 100B. Thus, the steps up to the formation of the second metal layer 18 will be omitted below. FIG. 17(a) shows a plan view after the second metal layer 18 is formed.

As shown in FIG. 16(a), after the second metal layer 18 is formed, a first insulating film 22f is deposited on the second metal layer 18. The first insulating film 22f does not include an organic insulating film formed of an organic insulating material. In this example, an $SiO_2$ film (film thickness: 50 to 1000 nm) is deposited by, for example, CVD, and then is annealed (in an atmosphere, 200 to 400° C., 0.5 to 4 hours), and then an $SiN_x$ film (film thickness: 50 to 1000 nm) is deposited to form the first insulating film 22f.

Next, as shown in FIG. 16(b), a first transparent electrode film is deposited on the first insulating film 22f and patterned to form the lower transparent electrode layer 38. In this example, a metal oxide film (film thickness: 20 to 300 nm) is formed by, for example, sputtering. Then, the first transparent electrode film is patterned by a photolithography process to form the lower transparent electrode layer 38 (transparent electrode 38k) on the first insulating film 22f. FIG. 17(b) is a plan view after the lower transparent electrode layer 38 is formed.

Next, a second insulating film is deposited on the first insulating film 22f and on the lower transparent electrode layer 38 to form a dielectric film (inorganic insulating film). In this example, an $SiN_x$ film (film thickness: 50 to 500 nm) is formed by, for example, CVD. Then, an opening 36a is formed in the dielectric film by dry etching or wet etching. In this step, the dielectric film is patterned so as not to expose the transparent electrode 38k. In more detail, the dielectric film is patterned so as not to expose the transparent electrode 38k in the opening 36a. Therefore, the dielectric layer 36 formed of the dielectric film covers an entire surface of the transparent electrode 38k.

The contact hole 22a is formed in the first insulating film 22f by dry etching or wet etching. For forming the contact hole 22a, as shown in FIG. 16(c), the first insulating film 22f is patterned so as to expose the surface of the second portion 16b of the oxide semiconductor layer 16 and the end 18E, of the drain electrode 18d, closer to the second portion 16b. In this step, the second portion 16b of the oxide semiconductor layer 16 may be used as an etching stopper. The etching for forming the opening 36a and the etching for forming the contact hole 22a may be performed in the same step. In the case where the opening 36a and the contact hole 22a are formed in the same step, the number of times of patterning is decreased as compared with in the case where the first insulating film 22f and the second insulating film (inorganic insulating film for forming the dielectric layer 36) are patterned separately. This decreases the manufacturing cost and improves the yield.

Next, a second transparent electrode film is deposited on the dielectric layer 36 and in the opening 36a and patterned to form the upper transparent electrode layer 34. In this example, a metal oxide film (film thickness: 20 to 300 nm) is formed by, for example, sputtering. Then, the second transparent electrode film is patterned by a photolithography process to form the upper transparent electrode layer 34 including the pixel electrode 34p. In this step, the first transparent electrode film is patterned such that a portion thereof that is in contact with the end 18E of the drain electrode 18d and also in contact with the surface of the second portion 16b of the oxide semiconductor layer 16 is left in the contact hole 22a. As a result, the TFT substrate 100C shown in FIG. 13 is obtained. FIG. 17(c) is a plan view after the upper transparent electrode layer 34 is formed.

Hereinafter, a method for forming the terminal portion 72Tc and the S-COM connection portion of the TFT substrate 100C will be described. FIG. 18(a) through FIG. 18(c) are each a schematic cross-sectional view showing a step for forming the terminal portion 72Tc of the TFT substrate 100C. FIG. 19(a) through FIG. 19(c) are each a schematic cross-sectional view showing a step for forming the S-COM connection portion of the TFT substrate 100C. The steps shown in FIG. 18(a) through FIG. 18(c) respectively correspond to the steps shown in FIG. 19(a) through FIG. 19(c). FIG. 18(a) through FIG. 18(c) respectively correspond to FIG. 16(a) through FIG. 16(c) referred to above, and FIG. 19(a) through FIG. 19(c) respectively correspond to FIG. 16(a) through FIG. 16(c) referred to above. In the following, the steps up to the formation of the second metal layer 18 (upper line layers 18t and 18u) will be omitted.

After the second metal layer 18 is formed, in the step of forming the first insulating film 22f, the first insulating film 22f is formed in the terminal portion 72Tc (FIG. 18(a)). The first insulating film 22f covers the upper line layer 18t. In the S-COM connection portion also, the first insulating film 22f is formed (FIG. 19(a)). The first insulating film 22f covers the upper line layer 18u.

Next, in the step of forming the lower transparent electrode layer 38, the lower transparent connection layer 38c is formed on the first insulating film 22f in the S-COM connection portion (FIG. 19(b)). In this step, the lower transparent connection layer 38c is formed so as not to overlap at least a part of the upper line layer 18u below the first insulating film 22f.

Next, in the step of forming the dielectric film, the dielectric film (not shown) is formed on the first insulating film 22f in the terminal portion 72Tc. Similarly in the S-COM connection portion, the dielectric film is formed on the first insulating film 22f. The dielectric film is formed so as to cover the lower transparent connection layer 38c (not shown).

Next, the dielectric film and the first insulating film 22f in the terminal portion 72Tc are patterned. As a result, the interlayer insulating layer 22 including the contact hole 22b located so as to overlap the upper liner layer 18t, and the dielectric layer 36 including the opening 36b at a position corresponding to the contact hole 22b, are formed (FIG. 18(c)). As shown in FIG. 18(c), the surface of the upper line layer 18t is exposed in the contact hole 22b.

Similarly in the S-COM connection portion, the dielectric film and the first insulating film 22f are patterned. As a result, the interlayer insulating layer 22 including the contact hole 22c located so as to overlap the upper liner layer 18u, and the dielectric layer 36 including the opening 36c at a position corresponding to the contact hole 22c, are formed (FIG. 19(c)). As shown in FIG. 19(c), the surface of the upper line layer 18u is exposed in the contact hole 22c. The opening 36c is formed so as to have a larger opening region than that of the contact hole 22c. In this step, at least a part of the lower transparent connection layer 38c is exposed in the opening 36c.

Next, in the step of forming the upper transparent electrode layer 34, the upper transparent connection layer 34t in contact with the surface of, and electrically connected with, the upper line layer 18t in the opening 36b is formed in the terminal portion 72Tc. As a result, the structure shown in FIG. 15(b) is realized. In the S-COM connection portion, the upper transparent electrode layer 34 in contact with the surface of the upper line layer 18u in the contact hole 22c and also in contact with the lower transparent connection layer 38c in the opening 36c is formed. Namely, the upper line layer 18u and the lower transparent connection layer 38c are electrically connected with each other via the upper transparent connection layer 34c. As a result, the structure shown in FIG. 15(c) is realized.

According to the embodiment 3 of the present invention, the drain electrode and the pixel electrode are connected with each other with no connection portion being provided therebetween. This simplifies the manufacturing process, and thus decreases the manufacturing cost and improves the yield.

A two-layer electrode structure may be formed by providing the transparent electrode on the liquid crystal layer side with respect to the pixel electrode, instead of on the substrate 11 side. In this case, the transparent conductive layer, which is the lower layer of the two-layer electrode structure (the layer closer to the substrate 11), acts as the pixel electrode. Hereinafter, with reference to FIG. 20, such a modification will be described.

FIG. 20(a) is a schematic cross-sectional view of a TFT substrate 100D, which is a modification of the TFT substrate 100C. FIG. 20(b) is a schematic plan view of the TFT substrate 100D. FIG. 20(a) is a cross-sectional view taken along line 20D-20D' in FIG. 20(b). The TFT substrate 100D shown in FIG. 20(a) and FIG. 20(b) may be the same as the TFT substrate 100A shown in FIG. 1 except for further including a dielectric layer 46 covering a lower transparent electrode layer 44 and an upper transparent electrode layer 48 formed on the dielectric layer 46. A pixel electrode 44p shown in FIG. 20(a) and FIG. 20(b) corresponds to the transparent conductive layer Tc of the TFT substrate 100A. In the TFT substrate 100D, the transparent conductive layer Tc acts as a pixel electrode as in the TFT substrate 100C.

The lower transparent electrode layer 44 includes the pixel electrode 44p. As shown in FIG. 20(a), the pixel electrode 44p is in contact with the top surface of the drain electrode 18d in the vicinity of the end 18E and the side surface of the drain electrode 18d in the contact hole 22a. Because of this structure, the pixel electrode 44p is electrically connected with the drain electrode 18d.

The dielectric layer 46 is formed so as to substantially cover an entire surface of the lower transparent electrode layer 44. As shown in FIG. 20(b), the upper transparent electrode layer 48 includes a transparent electrode 48k. The transparent electrode 48k is not electrically connected with the pixel electrode 44p. The transparent electrode 48k facing the pixel electrode 44p with the dielectric layer 46 being provided therebetween has a plurality of slits SL formed therein, and acts as a common electrode in the FFS mode. Therefore, the transparent electrodes 48k in the pixels have an equal potential during the operation of the TFT substrate 100D. An alignment film (not shown) may be located on the upper transparent electrode layer 48 (on the side opposite to the substrate 11). The TFT substrate 100D shown in FIG. 20(a) and FIG. 20(b) is preferably usable as an FFS mode liquid crystal display device.

In the case where one of the transparent conductive layers in the two-layer electrode structure acts as a common electrode in the FFS mode, a common signal is applied to the one transparent conductive layer. The common signal to be applied is common to the pixels. Therefore, the transparent conductive layer acting as the common electrode typically includes, between adjacent pixels, a portion overlapping the source line S and/or the gate line G.

In the TFT substrate 200D, the upper layer of the two-layer electrode structure (the layer farther from the substrate 11), namely, the transparent electrode 48k, acts as the common electrode. Therefore, as compared with in the case where the lower layer of the two-layer electrode structure (the layer closer to the substrate 11) acts as the common electrode, the parasitic capacitance caused by the structure in which the common electrode overlaps the source line S and/or the gate line G is decreased because of the provision of the dielectric layer 46. For this reason, increase in the power consumption, which occurs by the increase in the parasitic capacitance caused by the structure in which the common electrode overlaps the source line S and/or the gate line G, is suppressed.

In the TFT substrate 100D, the dielectric layer 46 is formed in the contact hole 22a. Therefore, the transparent electrode 48k may be provided at a position overlapping the contact hole 22a. This allows the two-layer electrode structure to be formed in the contact hole 22a, and thus allows a storage capacitance to be formed in the contact hole 22a. In the structure shown in FIG. 20(a) and FIG. 20(b) as an example, a slit SL is formed so as to overlap the contact hole 22a. It is not absolutely necessary to form a slit in the opening region of the contact hole 22a.

FIG. 21(a) schematically shows an example of planar structure of the TFT substrate 100D. FIG. 21(b) is a schematic cross-sectional view of a terminal included in a terminal portion 72Td shown in FIG. 21(a).

In the structure shown in FIG. 21(b) as an example, the interlayer insulating layer 20 is formed on the upper line layer 18t formed of the same metal film as that of the second metal layer 18, and includes the contact hole 22b at a position corresponding to the contact hole 14a of the gate insulating layer 14. In the contact hole 22b, the upper line layer 18t and a lower transparent connection layer 44t are in contact with each other. The dielectric layer 46 is formed on the lower transparent connection layer 44t, and includes an opening 46b at a position corresponding to the contact hole 22b of the interlayer insulating layer 22. In the opening 46b, the lower transparent connection layer 44t and an upper transparent connection layer 48t formed on the lower transparent connection layer 44t are in contact with each other. The lower transparent connection layer 44t is formed in the same layer as the pixel electrode 44p (formed in the lower transparent electrode layer 44). The upper transparent connection layer 48t is formed in the same transparent conductive layer as the common electrode 48k (formed in the upper transparent electrode layer 48). The lower transparent connection layer 44t may be omitted.

FIG. 21(c) is a schematic cross-sectional view of an S-COM connection portion. In FIG. 21(c), two embodiments of the S-COM connection portion are shown together. In the structure shown in FIG. 21(c) as an example, the interlayer insulating layer 22 includes the contact hole 22c formed so as to overlap the upper line layer 18u when viewed along a normal to the substrate 11. For example, as shown in a right part of FIG. 21(c), in the contact hole 22c, a lower transparent connection layer 44c formed in the same transparent conductive layer as the pixel electrode 44p (formed in the lower transparent electrode layer 44) and not electrically connected with the pixel electrode 44p is in contact with the upper line layer 18u. In an opening 46c, of the dielectric layer 46, located at a position corresponding to the contact hole 22c, the lower transparent connection layer 44c is in contact with an upper transparent connection layer 48c formed in the same layer as the common electrode 48k (formed in the upper transparent electrode layer 48) and electrically connected with the common electrode 48k. Namely, in the example shown in the right part of FIG. 21(c), the upper line layer 18u and the common electrode 48k are electrically connected with each other via the lower transparent connection layer 44c and the upper transparent connection layer 48c. Because of this structure, a common signal input to a terminal in the terminal portion 72Td may be supplied to the common electrode 48k via, for example, the lower line layer, the upper line layer 18u, the lower transparent connection layer 44c and the upper transparent connection layer 48c. As shown in a left part in FIG. 21(c), the upper transparent connection layer 48c and the upper line layer 18u may be in contact with each other in the contact hole 22c formed so as to overlap the upper line layer 18u.

Figure 22:
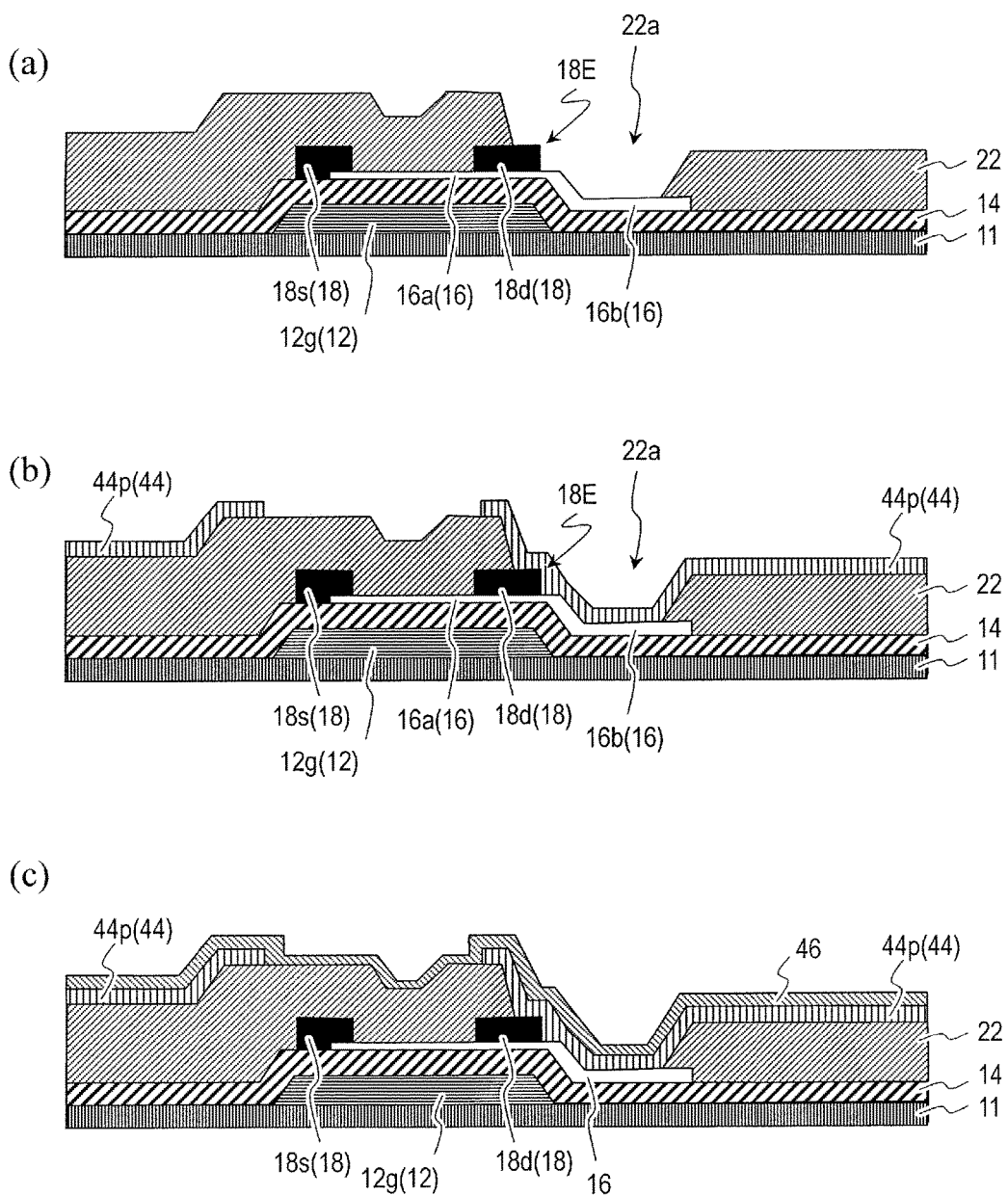
FIG. 22(a) through FIG. 22(c) are each a schematic cross-sectional view showing a step for forming a TFT portion of the TFT substrate 100D.

Now, with reference to FIG. 22, a method for manufacturing the above-described TFT substrate 100D will be described. FIG. 22(a) through FIG. 22(c) are each a schematic cross-sectional view showing a step for forming a TFT portion of the TFT substrate 100D. Up to the formation of the second metal layer 18, the manufacturing method may be substantially the same as that of the TFT substrate 100B. Thus, the steps up to the formation of the second metal layer 18 will be omitted below.

After the second metal layer 18 is formed, a first insulating film is deposited on the second metal layer 18 to form an interlayer insulating film. The first insulating film does not include an organic insulating film formed of an organic insulating material. In this example, an $SiO_2$ film (film thickness: 50 to 1000 nm) is deposited by, for example, CVD, and then is annealed (in an atmosphere, 200 to 400° C., 0.5 to 4 hours), and then an $SiN_x$ film (film thickness: 50 to 1000 nm) is deposited to form the interlayer insulating film.

Next, the contact hole 22a is formed in the interlayer insulating film formed on the second metal layer 18 by dry etching or wet etching. For forming the contact hole 22c, as shown in FIG. 22(a), the interlayer insulating film is patterned so as to expose the surface of the second portion 16b of the oxide semiconductor layer 16 and the end 18E, of the drain electrode 18d, closer to the second portion 16b. In this step, the second portion 16b of the oxide semiconductor layer 16 may be used as an etching stopper. As a result, the interlayer insulating layer 22 including contact hole 22a is formed on the second metal layer 18.

Next, as shown in FIG. 22(b), a first transparent electrode film is deposited on the interlayer insulating layer 22 and in the contact hole 22a and patterned to form the lower transparent electrode layer 44. In this example, a metal oxide film (film thickness: 20 to 300 nm) is formed by, for example, sputtering. Then, the first transparent electrode film is patterned by a photolithography process to form the lower transparent electrode layer 44 including the pixel electrode 44p. In this step, the first transparent electrode film is patterned such that a portion thereof that is in contact with the end 18E of the drain electrode 18d and also in contact with the surface of the second portion 16b of the oxide semiconductor layer 16 is left in the contact hole 22a.

Next, a second insulating film is deposited on the lower transparent electrode layer 44 to form a dielectric film (inorganic insulating film). In this example, an $SiN_x$ film (film thickness: 50 to 500 nm) is formed by, for example, CVD. The dielectric layer 46 formed of the dielectric film substantially covers an entire surface of the lower transparent electrode layer 44 (pixel electrode 44p).

Next, a second transparent electrode film is deposited on the dielectric layer 46 and patterned to form the upper transparent electrode layer 48. In this example, a metal oxide film (film thickness: 20 to 300 nm) is formed by, for example, sputtering. Then, the second transparent electrode film is patterned by a photolithography process to form the upper transparent electrode layer 48 including the common electrode 48k including a slit. As a result, the TFT substrate 100D shown in FIG. 20(a) and FIG. 20(b) is obtained.

Hereinafter, a method for forming the terminal portion 72Td and the S-COM connection portion of the TFT substrate 100D will be described. FIG. 23(a) through FIG. 23(c) are each a schematic cross-sectional view showing a step for forming the terminal portion 72Td of the TFT substrate 100D. FIG. 24(a) through FIG. 24(c) are each a schematic cross-sectional view showing a step for forming the S-COM connection portion of the TFT substrate 100D. The steps shown in FIG. 23(a) through FIG. 23(c) respectively correspond to the steps shown in FIG. 24(a) through FIG. 24(c). FIG. 23(a) through FIG. 23(c) respectively correspond to FIG. 22(a) through FIG. 22(c) referred to above, and FIG. 24(a) through FIG. 24(c) respectively correspond to FIG. 22(a) through FIG. 22(c) referred to above. In the following description, the steps up to the formation of the second metal layer 18 (upper line layers 18t and 18u) will be omitted.

After the second metal layer 18 is formed, in the step of forming the interlayer insulating layer 22, the interlayer insulating layer 22 including the contact hole 22b is formed in the terminal portion 72Td (FIG. 23(a)). The contact hole 22b is located so as to overlap the upper line layer 18t. The surface of the upper line layer 18t is exposed in the contact hole 22b. Similarly in the S-COM connection portion, the interlayer insulating layer 22 including the contact hole 22c is formed (FIG. 24(a)). The contact hole 22c is located so as to overlap the upper line layer 18u. The surface of the upper line layer 18u is exposed in the contact hole 22c.

Next, in the step of forming the lower transparent electrode layer 44, the lower transparent connection layer 44t in contact with the surface of the upper line layer 18t in the contact hole 22b is formed in the terminal portion 72Td (FIG. 23(b)). In the S-COM connection portion, as shown in a right part of FIG. 24(b), the lower transparent connection layer 44c is formed on the interlayer insulating layer 22 and in the contact hole 22c. The lower transparent connection layer 44c may be omitted (see a left part of FIG. 24(b)).

Next, in the step of forming the dielectric layer 46, the dielectric layer 46 including the opening 46b at a position corresponding to the contact hole 22b is formed in the terminal portion 72Td (FIG. 23(c)). Similarly in the S-COM connection portion, the dielectric layer 46 including the opening 46c at a position corresponding to the contact hole 22c is formed (FIG. 24(c)). As shown in FIG. 24(c), the opening 46c is typically formed so as to have a larger opening region than that of the contact hole 22c. The TFT substrate 100D is not limited to this example, and a part of the dielectric layer 46 may be located in the contact hole 22c as in the structure shown in FIG. 6(c).

Next, in the step of forming the upper transparent electrode layer 48, in the terminal portion 72Td, the upper transparent connection layer 48t in contact with a surface of, and electrically connected with, the lower transparent connection layer 44t in the opening 46b is formed. As a result, the structure shown in FIG. 21(b) is realized. In the S-COM connection portion, the upper transparent connection layer 48c in contact with the lower transparent connection layer 44c in the opening 46c is formed. As a result, the structure shown in the right part of FIG. 21(c) is realized. Alternatively, the upper transparent connection layer 48c in contact with the upper line layer 18u in the contact hole 22c may be formed in the opening 46c. As a result, the structure shown in the left part of FIG. 21(c) is realized.

Hereinafter, with reference to FIG. 25, an example of liquid crystal display device including a TFT substrate in an embodiment according to the present invention will be described.

Figure 25:
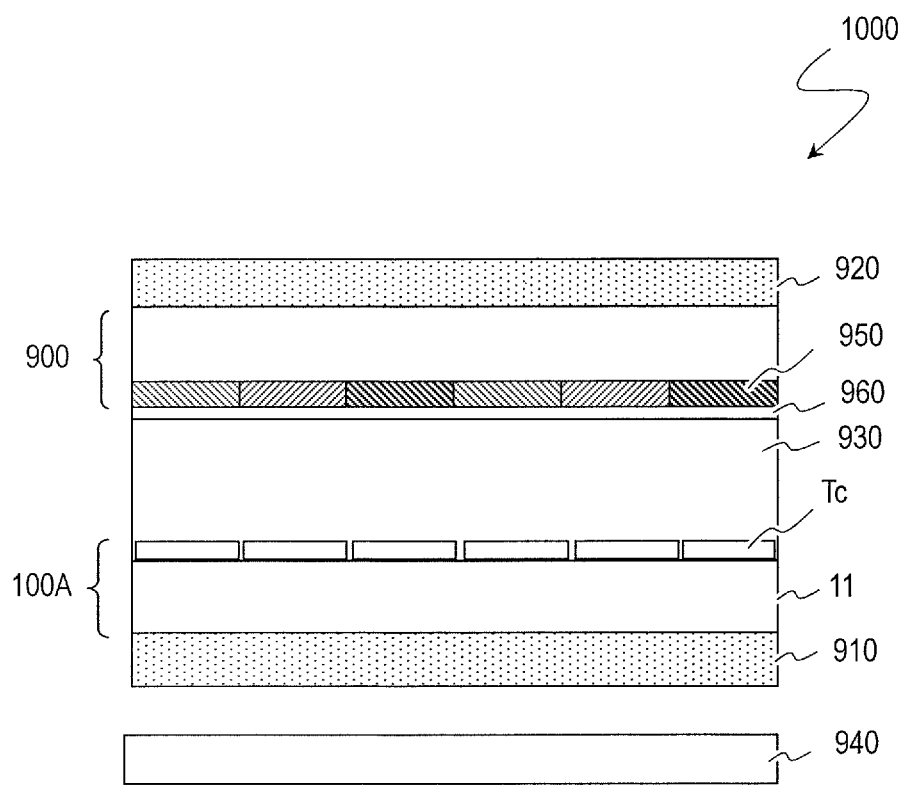
FIG. 25 is a schematic cross-sectional view of a liquid crystal display device 1000 including the TFT substrate 100A.

FIG. 25 is a schematic cross-sectional view of a liquid crystal display device 1000 including the TFT substrate 100A described above. The liquid crystal display device 1000 includes the TFT substrate 100A and a counter substrate 900 facing each other while having a liquid crystal layer 930 therebetween, polarization substrates 910 and 920 respectively located outer to the TFT substrate 100A and the counter substrate 900, and a backlight unit 940 outputting light for display toward the TFT substrate 100A. As a TFT substrate of the liquid crystal display device 1000, the TFT substrate 100B, the TFT substrate 100C or the TFT substrate 100D may be used instead of the TFT substrate 100A.

Although not shown, a scanning line driving circuit that drives the gate lines G and a signal line driving circuit that drives the source lines S are located in a peripheral region of the TFT substrate 100A. The scanning line driving circuit and the signal line driving circuit are connected to a control circuit located outer to the TFT substrate 100A. In accordance with the control performed by the control circuit, a scanning signal that switches the TFT to be on or off is supplied from the scanning line driving circuit to a gate line G, and a display signal (voltage to be applied to the transparent conductive layer Tc, which is a pixel electrode) is supplied from the signal line driving circuit to a source line S.

The counter substrate 900 includes a color filter 950. In the case where three primary color display is performed, the color filter 950 includes an R (red) filter, a G (green) filter and a B (blue) filter each located in accordance with a pixel. A counter electrode 960 is located on a surface of the liquid crystal layer 930 on the color filter 950 side. In the case where a transverse electric field mode such as the FFS mode or the like is adopted, the counter electrode 960 is omitted.

In the liquid crystal display device 1000, liquid crystal molecules in the liquid crystal layer 930 are aligned on a pixel-by-pixel basis in accordance with the potential difference applied between the transparent conductive layer Tc as the pixel electrode of the TFT substrate 100A and the counter electrode 960, and thus display is provided.

According to an embodiment of the present invention, light leak caused by the disturbance of the alignment state of the liquid crystal molecules in the vicinity of the contact hole is suppressed. Therefore, the ratio of the light-blocking region with respect to the pixel is decreased. For this reason, the light utilization efficiency is improved as compared with in the conventional art.

INDUSTRIAL APPLICABILITY

An embodiment according to the present invention is widely applicable to an active matrix substrate, a transmission-type display device, and the like, and is especially preferably applicable to a high precision liquid crystal display device.

REFERENCE SIGNS LIST 100A, 100B, 100C, 100D TFT substrate (semiconductor device)
10 TFT
11 Substrate
12 First metal layer
12g Gate electrode
14 Gate insulating layer
16 Oxide semiconductor layer
18 Second metal layer
18s Source electrode
18d Drain electrode
18u Upper line layer
22 Interlayer insulating layer
22a, 22c Contact hole
22f Insulating film
TE Transparent electrode layer
24, 38, 44 Lower transparent electrode layer
Tc Transparent conductive layer
24h Connection portion
24k, 38k, 48k Transparent electrode
24c, 38c, 44c Lower transparent connection layer
26, 36, 46 Dielectric layer
26a, 26c, 36c, 46c Opening
28, 34, 48 Upper transparent electrode layer
28p, 34p, 48p Pixel electrode
28c, 34c, 48c Upper transparent connection layer
72Tb, 72Tc, 72Td Terminal portion
900 Counter substrate
930 Liquid crystal layer
1000 Liquid crystal display device

The invention claimed is:

1. A semiconductor device including a substrate and a thin film transistor supported by the substrate, the semiconductor device comprising:
   a first metal layer including a gate electrode of the thin film transistor;
   a gate insulating layer formed on the first metal layer;
   an oxide semiconductor layer formed on the gate insulating layer and including an active layer of the thin film transistor, the oxide semiconductor layer including a first portion formed so as to overlap the gate electrode and a second portion extending from the first portion while crossing an edge at one end of the gate electrode;
   a second metal layer formed on the oxide semiconductor layer and including a source electrode and a drain electrode of the thin film transistor, the drain electrode being located closer to the second portion than the source electrode is;
   an interlayer insulating layer formed on the second metal layer and including a first contact hole; and
   a first transparent electrode layer formed on the interlayer insulating layer and in the first contact hole;
   wherein:
   the interlayer insulating layer does not include an organic insulating layer;
   the first contact hole is formed so as to overlap the second portion of the oxide semiconductor layer and an end of the drain electrode closer to the second portion, when viewed along a normal to the substrate; and
   the first transparent electrode layer includes a transparent conductive layer in contact with the end of the drain electrode and the second portion of the oxide semiconductor layer in the first contact hole.

2. The semiconductor device according to claim 1, further comprising:
   a dielectric layer formed on the first transparent electrode layer and including a first opening formed at a position corresponding to the first contact hole; and
   a second transparent electrode layer formed on the dielectric layer and in the first opening;
   wherein:
   the first transparent electrode layer includes a first electrode not electrically connected with the transparent conductive layer; and
   the second transparent electrode layer includes a second electrode in contact with the transparent conductive layer in the first opening.

3. The semiconductor device according to claim 2, wherein the first electrode faces the second electrode with the dielectric layer being provided between the first electrode and the second electrode.

4. The semiconductor device according to claim 2, comprising a plurality of pixels; wherein:
the plurality of pixels each include the thin film transistor, the first electrode and the second electrode;
the first electrode acts as a common electrode; and
the second electrode acts as a pixel electrode.

5. The semiconductor device according to claim 2, wherein:
the second metal layer includes an upper line layer;
the first transparent electrode layer includes a first transparent connection layer electrically connected with the first electrode;
the second transparent electrode layer includes a second transparent connection layer;
the interlayer insulating layer includes a second contact hole;
the second contact hole is formed so as to overlap the upper line layer when viewed along a normal to the substrate;
the dielectric layer includes a second opening formed at a position corresponding to the second contact hole; and
the second transparent connection layer is in contact with the upper line layer in the second contact hole and is in contact with the first transparent connection layer in the second opening.

6. The semiconductor device according to claim 2, wherein:
the second metal layer includes an upper line layer;
the first transparent electrode layer includes a first transparent connection layer electrically connected with the first electrode;
the interlayer insulating layer includes a second contact hole;
the second contact hole is formed so as to overlap the upper line layer when viewed along a normal to the substrate; and
the first transparent connection layer is in contact with the upper line layer in the second contact hole.

7. The semiconductor device according to claim 1, comprising a plurality of pixels; wherein:
the plurality of pixels each include the thin film transistor and the transparent conductive layer; and
the transparent conductive layer acts as a pixel electrode.

8. The semiconductor device according to claim 7, further comprising:
a dielectric layer located between the interlayer insulating layer and the first transparent electrode layer; and
a second transparent electrode layer located between the interlayer insulating layer and the dielectric layer;
wherein the second transparent electrode layer includes a transparent electrode not electrically connected with the transparent conductive layer.

9. The semiconductor device according to claim 8, wherein the transparent electrode acts as a common electrode.

10. The semiconductor device according to claim 8, wherein:
the second metal layer includes an upper line layer;
the first transparent electrode layer includes a first transparent connection layer;
the second transparent electrode layer includes a second transparent connection layer electrically connected with the transparent electrode;
the interlayer insulating layer includes a second contact hole;
the second contact hole is formed so as to overlap the upper line layer when viewed along a normal to the substrate;
the dielectric layer includes an opening formed at a position corresponding to the second contact hole; and
the first transparent connection layer is in contact with the upper line layer in the second contact hole and is in contact with the second transparent connection layer in the opening.

11. The semiconductor device according to claim 7, further comprising:
a dielectric layer covering the first transparent electrode layer; and
a second transparent electrode layer formed on the dielectric layer;
wherein the second transparent electrode layer includes a transparent electrode not electrically connected with the transparent conductive layer, and the transparent electrode acts as a common electrode.

12. The semiconductor device according to claim 11, wherein:
the second metal layer includes an upper line layer;
the interlayer insulating layer includes a second contact hole;
the second contact hole is formed so as to overlap the upper line layer when viewed along a normal to the substrate;
the dielectric layer includes an opening formed at a position corresponding to the second contact hole;
the second transparent electrode layer includes a transparent connection layer electrically connected with the transparent electrode; and
the transparent connection layer is in contact with the upper line layer in the second contact hole in the opening.

13. The semiconductor device according to claim 11, wherein:
the second metal layer includes an upper line layer;
the interlayer insulating layer includes a second contact hole;
the second contact hole is formed so as to overlap the upper line layer when viewed along a normal to the substrate;
the dielectric layer includes an opening formed at a position corresponding to the second contact hole;
the first transparent electrode layer includes a first transparent connection layer not electrically connected with the transparent conductive layer;
the second transparent electrode layer includes a second transparent connection layer electrically connected with the transparent electrode;
the first transparent connection layer is in contact with the upper line layer in the second contact hole; and
the second transparent connection layer is in contact with the first transparent connection layer in the opening.

14. The semiconductor device according to claim 1, wherein the oxide semiconductor layer contains an In—Ga—Zn—O-type semiconductor.

15. The semiconductor device according to claim 14, wherein the In—Ga—Zn—O-type semiconductor contains a crystalline portion.

16. A display device, comprising:
the semiconductor device according to claim 1;
a counter substrate located so as to face the semiconductor device; and
a liquid crystal layer located between the counter substrate and the semiconductor device.

17. A method for manufacturing a semiconductor device, comprising:
- step (a) of forming a first metal layer including a gate electrode on a substrate;
- step (b) of forming a gate insulating layer covering the first metal layer;
- step (c) of forming an oxide semiconductor layer on the gate insulating layer, the oxide semiconductor layer including a first portion formed so as to overlap the gate electrode and a second portion extending from the first portion while crossing an edge at one end of the gate electrode;
- step (d) of forming a second metal layer on the oxide semiconductor layer, the second metal layer including a source electrode and a drain electrode located closer to the second portion than the source electrode is;
- step (e) of forming an interlayer insulating film on the second metal layer, the interlayer insulating film not including an organic insulating film;
- step (f) of etching the interlayer insulating film to form a contact hole exposing a surface of the second portion of the oxide semiconductor layer and an end of the drain electrode that is closer to the second portion; and
- step (g) of forming a transparent conductive layer in contact with the end of the drain electrode and the surface of the second portion of the oxide semiconductor layer in the contact hole.

18. The method for manufacturing a semiconductor device according to claim 17, wherein in step (f), the interlayer insulating film is etched using the oxide semiconductor layer as an etching stopper.

19. The method for manufacturing a semiconductor device according to claim 17, wherein the oxide semiconductor layer contains an In—Ga—Zn—O-type semiconductor.

20. The method for manufacturing a semiconductor device according to claim 19, wherein the In—Ga—Zn—O-type semiconductor contains a crystalline portion.

* * * * *